(12) United States Patent
Tanabe et al.

(10) Patent No.: US 6,323,510 B1
(45) Date of Patent: *Nov. 27, 2001

(54) SEMICONDUCTOR MEMORY DEVICE HAVING AN ARRAY OF MEMORY CELLS INCLUDING A SELECT TRANSISTOR AND A STORAGE CAPACITOR WIRING LINES AT 45° ANGLES

(75) Inventors: Nobuhiro Tanabe; Kazushi Amanuma, both of Tokyo (JP)

(73) Assignee: NEC Corporation (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,819

(22) Filed: Feb. 13, 1998

(30) Foreign Application Priority Data

Feb. 14, 1997 (JP) .................................................. 9-030358

(51) Int. Cl.[7] .................................................. H01L 29/76
(52) U.S. Cl. ..................... 257/295; 257/310; 257/311; 438/240; 438/3
(58) Field of Search ..................... 257/295, 310, 257/311; 438/240

(56) References Cited

U.S. PATENT DOCUMENTS

| | | | | |
|---|---|---|---|---|
| 5,350,705 | * | 9/1994 | Brassington et al. | 257/295 |
| 5,371,699 | | 12/1994 | Larson | 365/145 |
| 5,604,145 | * | 2/1997 | Hashizume et al. | 438/240 |
| 6,097,073 | * | 8/2000 | Rostoker et al. | 247/401 |

FOREIGN PATENT DOCUMENTS

| | | | | |
|---|---|---|---|---|
| 07-161828 | * | 6/1995 | (JP) | . |
| 7-161828 | | 6/1995 | (JP) | H01L/21/8242 |
| 7226443 | | 8/1995 | (JP) | H01L/21/8242 |
| 6188386 | | 7/1994 | (JP) | H01L/27/108 |
| 4144282 | | 5/1992 | (JP) | H01L/27/112 |
| 6-209113 | | 7/1994 | (JP) | H01L/29/788 |

\* cited by examiner

Primary Examiner—Olik Chaudhuri
Assistant Examiner—Howard Weiss
(74) Attorney, Agent, or Firm—Hayes, Soloway, Hennessey, Grossman & Hage, P.C.

(57) ABSTRACT

A semiconductor memory device is provided, which prevents the characteristic of storage capacitors from degrading without chip-area increase of memory cells. Each of storage capacitors has a dielectric sandwiched by lower and upper electrodes. The lower electrodes are formed by a patterned, common electrically-conductive layer. The dielectrics are formed by a patterned, common ferroelectric layer formed on the common electrically-conductive layer which is entirely overlapped with the common electrically-conductive layer. The upper electrodes are regularly arranged on the common ferroelectric layer and are located outside the rows and columns of a matrix array where the windows of the common electrically-conductive layer and common ferroelectric layer are aligned. Wiring lines are formed over the upper electrodes through an interlayer insulating layer covering the storage capacitors, thereby electrically connecting the upper electrodes and select transistors.

10 Claims, 22 Drawing Sheets

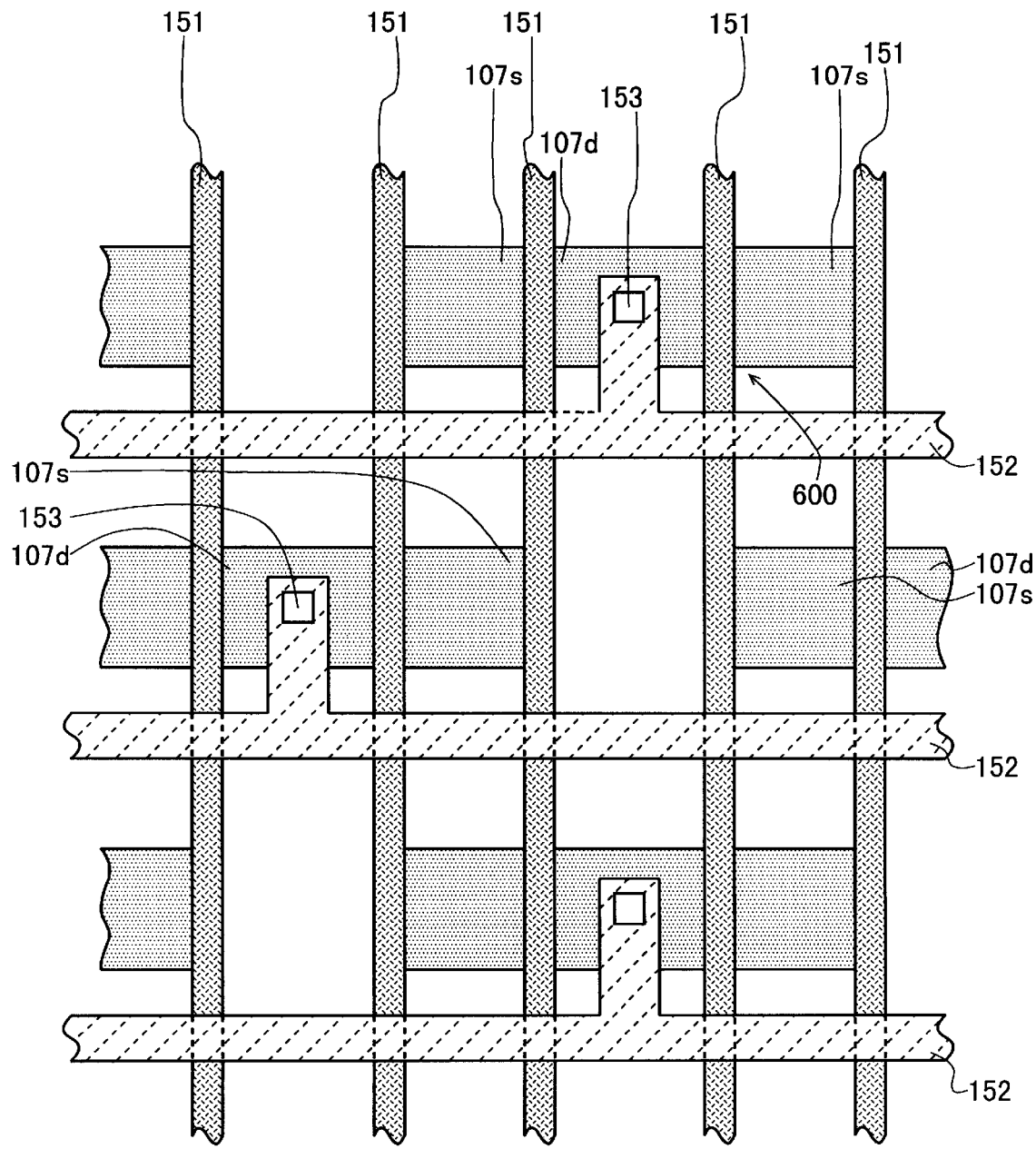

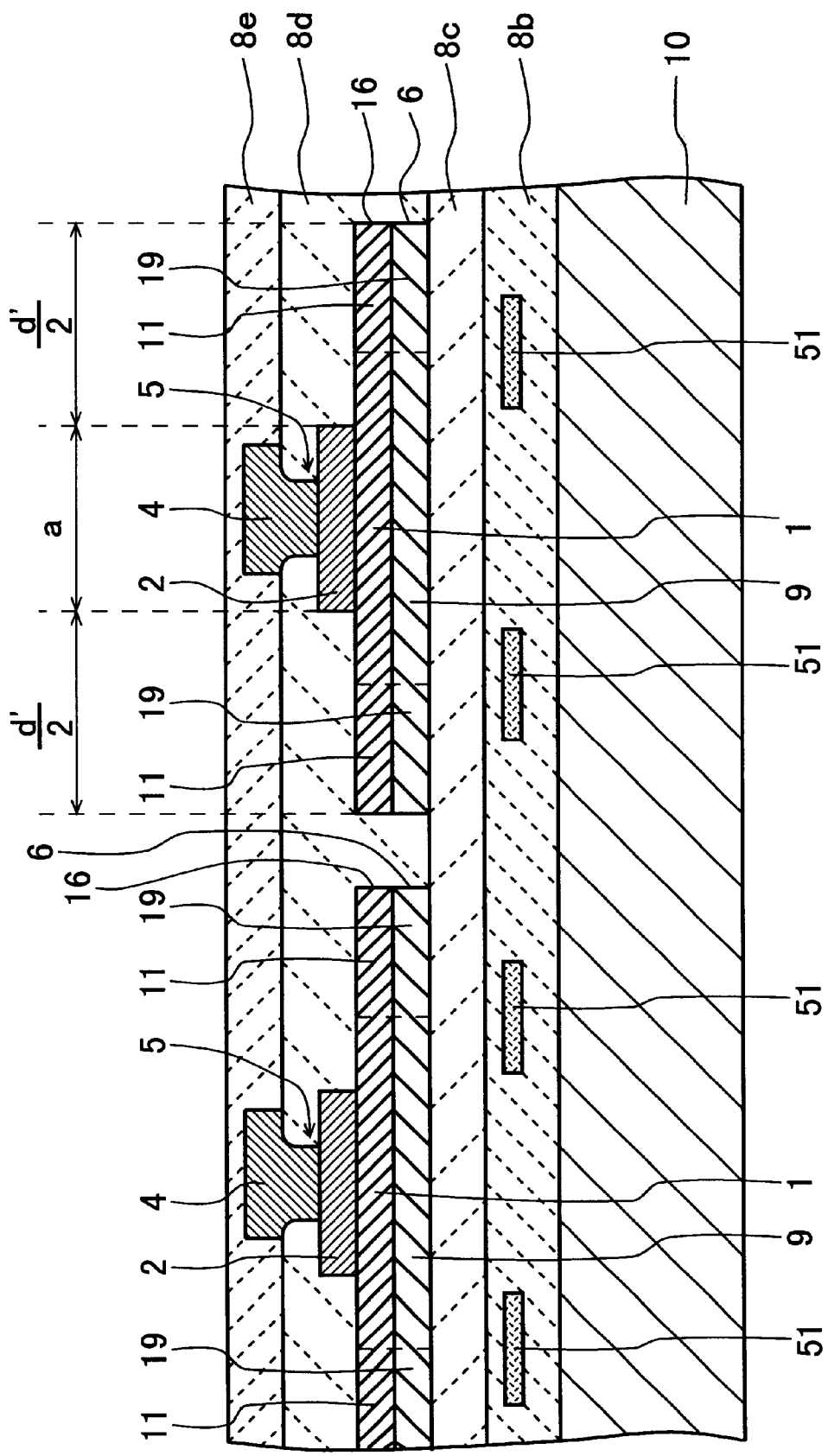

SEMICONDUCTOR MEMORY DEVICE HAVING AN ARRAY OF MEMORY CELLS INCLUDING A SELECT TRANSISTOR AND A STORAGE CAPACITOR WIRING LINES AT 45° ANGLES

BACKGROUND OF THE INVENTION

1. Field of the Invention

The present invention relates to a semiconductor memory device and more particularly, to a semiconductor memory device each memory cell of which is comprised of a select transistor and a ferroelectric storage capacitor for electric-charge storing.

2. Description of the Prior Art

FIG. 1 shows a memory cell structure of a conventional semiconductor memory device of this sort, which is disclosed in the Japanese Non-Examined Patent Publication No. 4-144282 published in May 1992.

This conventional semiconductor memory device has a lot of memory cells 800 with a same structure, which are arranged in a matrix array. However, only two ones of the cells 800 are shown in FIG. 1 for the sake of simplification of description.

As shown in FIG. 1, each of the memory cells 800 has a Metal-Oxide-Semiconductor Field-Effect Transistor (MOSFET) 600 serving as a select transistor and a storage capacitor 700 for electric-charge storing.

The MOSFET 600 is formed by a source region 107s and a drain region 107d formed in a semiconductor substrate (not shown), and a common gate electrode 151 formed over the substrate through a gate oxide layer (not shown). The common gate electrode 151 serves as word lines electrically connecting the corresponding gate electrodes 151 to one another.

The drain region 107d is electrically connected to an overlying bit line 152 through a contact hole 153.

The source region 107s is electrically connected to an overlying wiring layer 104 through a contact hole 103. The wiring layer 104 is electrically connected to an underlying upper electrode 102 of the storage capacitor 700. Thus, the source region 107s is electrically connected to the overlying upper electrode 102 of the storage capacitor 700.

The storage capacitor 700 has a square-shaped ferroelectric 101 sandwiched by a strip-shaped, common lower electrode 109 and the square-shaped upper electrode 102. The common lower electrode 109 extends along a word line 151 perpendicular to the bit line 1152. The ferroelectric 101 has a slightly wider area than the upper electrode 102. The ferroelectric 101 has a same width as the lower electrode 109.

The lower electrode 109 is electrically connected to an overlying wiring layer 114 through a contact hole 112. The wiring layer 114 is electrically connected to an overlying wiring layer 154 through a contact hole 115. Thus, the lower electrode 109 is electrically connected to the wiring layer 154. The wiring layer 154 extends along the lower electrode 109 and is overlapped therewith.

As described above, in the conventional memory cell structure shown in FIG. 1, the common lower electrode 109 is commonly used by the memory cells 800 arranged along the word line 151.

FIGS. 2A to 2C show a memory cell layout of another conventional semiconductor memory device, where a lot of memory cells 800 with substantially the same structure as shown in FIG. 1 are arranged in a matrix array. FIG. 3 shows a cross section along the line III—III in FIG. 2A.

As clearly shown in FIGS. 2B and 3, source regions 107s and drain regions 107d of MOSFETs 600 are formed in a semiconductor substrate 110. Gates electrodes 151, which serve as word lines, are arranged over the substrate 110 through corresponding gate oxide layers 108a. Each pair of the source and drain regions 107s and 107d are located at each side of a corresponding one of the gate electrodes 151.

Bit lines 152 are formed on an interlayer insulating layer 108b covering the gate electrodes or word lines 151. The bit lines 152 are contacted with and electrically connected to the corresponding drain regions 197d through corresponding contact holes 153 penetrating the interlayer insulating layer 108b.

Strip-shaped lower electrodes 109 of storage capacitors 700 are formed on an interlayer insulating layer 108c covering the bit lines 152. The lower electrodes 109 extend along the word lines 151. Square-shaped ferroelectrics 101 of the storage capacitors 700 are formed on the corresponding square-shaped lower electrodes 109. Square-shape upper electrodes 102 of the storage capacitors 700 are formed on the corresponding ferroelectrics 101.

Each of the ferroelectrics 101 has a same area as a corresponding one of the lower electrodes 109. In other words, each of the ferroelectrics 101 is entirely overlapped with a corresponding one of the lower electrodes 109. Each of the upper electrodes 102 has a narrower area than a corresponding one of the lower electrodes 109. In other words, each of the upper electrodes 102 is included in a corresponding one of the ferroelectrics 101

The storage capacitors 700 are located just over the corresponding drain regions 107d or just over the positions between the adjoining source regions 107s.

Wiring layers 104 are formed on an interlayer insulating layer 108d covering the storage capacitors 700. The wiring layers 104 are contacted with and electrically connected to the upper electrodes 102 through corresponding square-shaped contact holes 105 penetrating the interlayer insulating layer 108d. The wiring layers 104 are further contacted with and electrically connected to the source regions 107s through corresponding square-shaped contact holes 103 penetrating the interlayer insulating layers 108d, 108c, and 108b.

The wiring layers 104 are covered with an interlayer insulating layer 108e.

Here, it is supposed that one side of the square-shaped upper electrode 102 has a length of a, the side length a of the upper electrode 102 and the width of the lower electrode 109 has a difference of d, the opposing ends of the lower electrode 109 and the corresponding contact hole 105 has a distance of x, one side of the square-shaped contact hole 105 has a length of c, and the opposing ends of the adjoining upper electrodes 109 has a distance of y. Then, the chip area Sc of each memory cell 800 is expressed by the following expression (1).

$$Sc = (d/2 + a + d/2 + x + c + x) \cdot (a + y) \quad (1)$$
$$= (a + d + c + 2x) \cdot (a + y)$$

If the difference d is increased to (d+Δd), the chip area Sc is expressed as the following expression (2).

$$Sc = (a + d + \Delta d + c + 2x) \cdot (a + y) \quad (2)$$

Therefore, the chip area Sc is increased by $$\Delta d \cdot (a+y).$$

For example, if the size difference d is set as a small value of 0.2 μm, the remanent polarization of the ferroelectric layers 101 tends to degrade to approximately 60% of its inherent value after the formation processes of the storage capacitors 700. This is because the side ends of ferroelectrics 101 extending in parallel to the word lines 151 are damaged due to the etching or milling action during the patterning process for the ferroelectrics 101.

Therefore, to prevent this damage, the size difference d needs to be set as approximately 1.0 μm or more. In this case, however, this large value of the difference d will cause a problem that the chip area Sc of the memory cell 800 is increased. This problem prevents higher integration of the memory cells 800.

In the case where the size difference d is set as 0.2 μm, if a=2.0 μm, x=0.6 μm, c=0.9 μm, and y=2.0 μm, the chip area Sc is given from the above expression (1) as follows.

$$(2.0+0.2+0.9+2\times0.6)\cdot(2.0+2.0)=17.2 \ \mu m^2$$

On the other hand, when only the size difference d is increased to 1.0 μm, the chip area Sc is given as follows.

$$(2.0+1.0+0.9+2\times0.6)\cdot(2.0+2.0)=20.4 \ \mu m^2$$

Therefore, by increasing the size difference d by 0.8 μm, the chip area Sc is increased by 3.2 μm² (which is equal to approximately 19% of 17.2 μm²).

Next, the reliability degradation due to parasitic capacitance is explained below.

In the conventional semiconductor memory device shown in FIGS. 2 and 3, the lower electrodes 109s are strip-shaped and extend along the word lines 151. Therefore, the parasitic capacitance between the lower electrodes 109 and any adjoining electrically-conductive lines such as the word lines 151 is small. However, if a specific one of the electrically-conductive lines located in the vicinity of the lower electrodes 109 is subjected to a large electric-potential change, and at the same time, the parasitic capacitance between the specific electrically-conductive line and the lower electrodes 109 is comparatively large, the electric potential of the lower electrodes 109 tends to fluctuate or deviate due to the electric-potential change of the specific electrically-conductive line.

For example, if each of the strip-shaped lower electrodes 109 has a parasitic capacitance of 0.6 fF, the electric potential of the lower electrodes 109 will deviate by 60 mV due to an electric-potential change of 5 V of a specific one of the electrically-conductive lines, where $$5 \ V \cdot (0.6 \ fF/50 \ fF)=60 \ mV.$$

As described above, The conventional semiconductor device shown in FIGS. 2A to 2C and FIG. 3 has the following problems:

First, if the size difference d between the upper electrodes 102 and the ferroelectrics 101 is increased to a specific value to avoid the degradation of the characteristic of the storage capacitors 700 due to the damage applied in its formation process, the chip area Sc of the memory cells 800 is increased. This prevents higher integration of the cells 800.

Second, if a specific one of the electrically-conductive lines located in the vicinity of the lower electrodes 109 is subjected to a large electric-potential change, the electric potential of the lower electrodes 109 tends to fluctuate or deviate due to the electric-potential change of the specific electrically-conductive line.

SUMMARY OF THE INVENTION

Accordingly, an object of the present invention is to provide a semiconductor memory device that prevents the characteristic of storage capacitors from degrading without chip-area increase of memory cells.

Another object of he present invention is to provide a semiconductor memory device having improved reliability.

Still another object of the present invention is to provide a semiconductor memory device capable of higher integration of memory cells.

The above objects together with others not specifically mentioned will become clear to those skilled in the art from the following description.

A semiconductor memory device according to a first aspect of the present invention is comprised of memory cells formed on a semiconductor substrate.

Each of the memory cells includes a select transistor formed on the substrate and a storage capacitor for electric-charge storing formed over the substrate through a first interlayer insulating layer.

Each of the storage capacitors has a lower electrode, an upper electrode, and a dielectric sandwiched by the lower and upper electrodes.

The lower electrodes are formed by a patterned, common electrically-conductive layer formed on the first interlayer insulating layer. The common electrically-conductive layer has a first plurality of windows arranged regularly in rows and columns of a matrix array.

The dielectrics are formed by a patterned, common ferroelectric layer formed on the common electrically-conductive layer. The common ferroelectric layer is entirely overlapped with the common electrically-conductive layer. The common ferroelectric layer has a second plurality of windows overlapped with the first plurality of windows of the common electrically-conductive layer.

The upper electrodes are regularly arranged on the common ferroelectric layer. The upper electrodes are located outside the rows and columns of the matrix array in which the first plurality of windows of the common electrically-conductive layer and the second plurality of windows of the common ferroelectric layer are aligned.

Wiring lines are formed over the upper electrodes through a second interlayer insulating layer covering the storage capacitors. The wiring lines are electrically connected to the upper electrodes through a first plurality of contact holes penetrating the second interlayer insulating layer. The wiring lines are electrically connected to the select transistors through the second plurality of windows of the common ferroelectric layer, the first plurality of windows of the common electrically-conductive layer, and a second plurality of contact holes penetrating the second and first interlayer insulating layers.

With the semiconductor memory device according to the first aspect of the present invention, the lower electrodes are formed by the patterned, common electrically-conductive layer formed on the first interlayer insulating layer. The dielectrics of the storage capacitors are formed by the patterned, common ferroelectric layer formed on the common electrically-conductive layer, and they are entirely overlapped with the common electrically-conductive layer.

Further, the upper electrodes are regularly arranged on the common ferroelectric layer, and they are located outside the rows and columns of the matrix array in which the first plurality of windows of the common electrically-conductive layer and the second plurality of windows of the common ferroelectric layer are aligned.

Therefore, the size of the upper and lower electrodes may be optionally determined within a wide range. This means that the size difference between the upper electrodes and the dielectrics may be increased as necessary without increasing the chip-area of the memory cells This leads to higher integration of the memory cells.

On the other hand, if a parasitic capacitance of the lower electrodes with respect to a specific electrically-conductive line which is subjected to a large electric-potential change is sufficiently smaller than a parasitic capacitance of the lower electrodes with respect to the remaining electrically-conductive lines which are subjected to no electric-potential change, electric-potential change of the lower electrodes may be suppressed in spite of the large electric-potential change of the specific electrically-conductive line.

In the device according to the first aspect, because the lower electrodes are formed by the patterned, common electrically-conductive layer, a same electric potential is applied to the lower electrodes on operation. Thus, the parasitic capacitance of the lower electrodes with respect to the remaining electrically-conductive lines becomes large. As a result, the electric-potential change of the lower electrodes is suppressed in spite of the large electric-potential change of the specific electrically-conductive line. This means that the semiconductor memory device according to the first aspect has improved reliability.

In a preferred embodiment of the device according to the first aspect of the present invention, each of the first plurality of windows of the lower electrodes has a closed contour, and each of the second plurality of windows of the dielectrics has a closed contour.

In this case, it is preferred that the closed contour of the first plurality of windows is a same as the closed contour of the second plurality of windows. It is preferred that the wiring lines extend obliquely to the rows and columns in which the second and first pluralities of windows are aligned.

In another preferred embodiment of the device according to the first aspect of the present invention, each of the first plurality of windows of the lower electrodes has a linear shape extending along the rows or columns in which the second and first pluralities of windows are aligned, and each of the second plurality of windows of the dielectrics has a linear shape entirely overlapped with the first plurality of windows.

A semiconductor memory device according to a second aspect of the present invention has the same configuration as that of the semiconductor memory device according to the first aspect except that the upper electrodes are regularly arranged on the common ferroelectric layer so that the upper electrodes are located in the rows or columns in which the second and first pluralities of windows are aligned.

With the semiconductor memory device according to the second aspect of the present invention, the lower electrodes are formed by the patterned, common electrically-conductive layer formed on the first interlayer insulating layer. The dielectrics are formed by the patterned, common ferroelectric layer formed on the common electrically-conductive layer, and they are entirely overlapped with the common electrically-conductive layer.

Further, the upper electrodes are regularly arranged on the common ferroelectric layer, and they are located in the rows and columns of the matrix array in which the first plurality of windows of the common electrically-conductive layer and the second plurality of windows of the common ferroelectric layer are aligned.

Therefore, the size of the upper electrodes may be optionally determined within a wide range. This means that the size difference between the upper and lower electrodes may be increased as necessary without increasing the chip-area of the memory cells. This leads to higher integration of the memory cells.

Further, because the lower electrodes are formed by the patterned, common electrically-conductive layer, a same electric potential is applied to the lower electrodes on operation. Thus, the parasitic capacitance of the lower electrodes with respect to the remaining electrically-conductive lines becomes large. As a result, the electric-potential change of the lower electrodes is suppressed in spite of the large electric-potential change of the specific electrically-conductive line. This means that the semiconductor memory device according to the second aspect has improved reliability.

In a preferred embodiment of the device according to the second aspect of the present invention, each of the first plurality of windows of the lower electrodes has a closed contour, and each of the second plurality of windows of the dielectrics has a closed contour.

In this case, it is preferred that the closed contour of the first plurality of windows is a same as the closed contour of the second plurality of windows. It is preferred that the wiring lines extend along the rows and columns in which the second and first pluralities of windows are aligned.

In another preferred embodiment of the device according to the second aspect of the present invention, each of the first plurality of windows of the lower electrodes has a strip-like shape extending along the rows or columns in which the second and first pluralities of windows are aligned, and each of the second plurality of windows of the dielectrics has a strip-like shape extending along the first plurality of windows. Two adjacent ones of the lower electrodes are electrically connected to one another through a connection part of the common electrically-conductive layer.

In still another preferred embodiment of the device according to the second aspect of the present invention, each of the first plurality of windows of the lower electrodes has a strip-like shape extending along the rows or columns in which the second and first pluralities of windows are aligned, and each of the second plurality of windows of the dielectrics has a strip-like shape extending along the first plurality of windows. The common electrically-conductive layer is divided into parts by the first plurality of windows, and the common ferroelectric layer is divided onto parts by the second plurality of windows. The lower electrodes are electrically connected to one another through an interconnection line.

BRIEF DESCRIPTION OF THE DRAWINGS

In order that the present invention may be readily carried into effect, it will now be described with reference to the accompanying drawings.

FIG. 2B shows a layout of the source and drain regions of and the gate electrodes of the select MOSTETs of the conventional semiconductor memory device shown in FIG. 2A.

FIG. 10 shows a cross section along the line X—X in FIG. 8A.

DETAILED DESCRIPTION OF THE PREFERRED EMBODIMENTS

Figure 1:
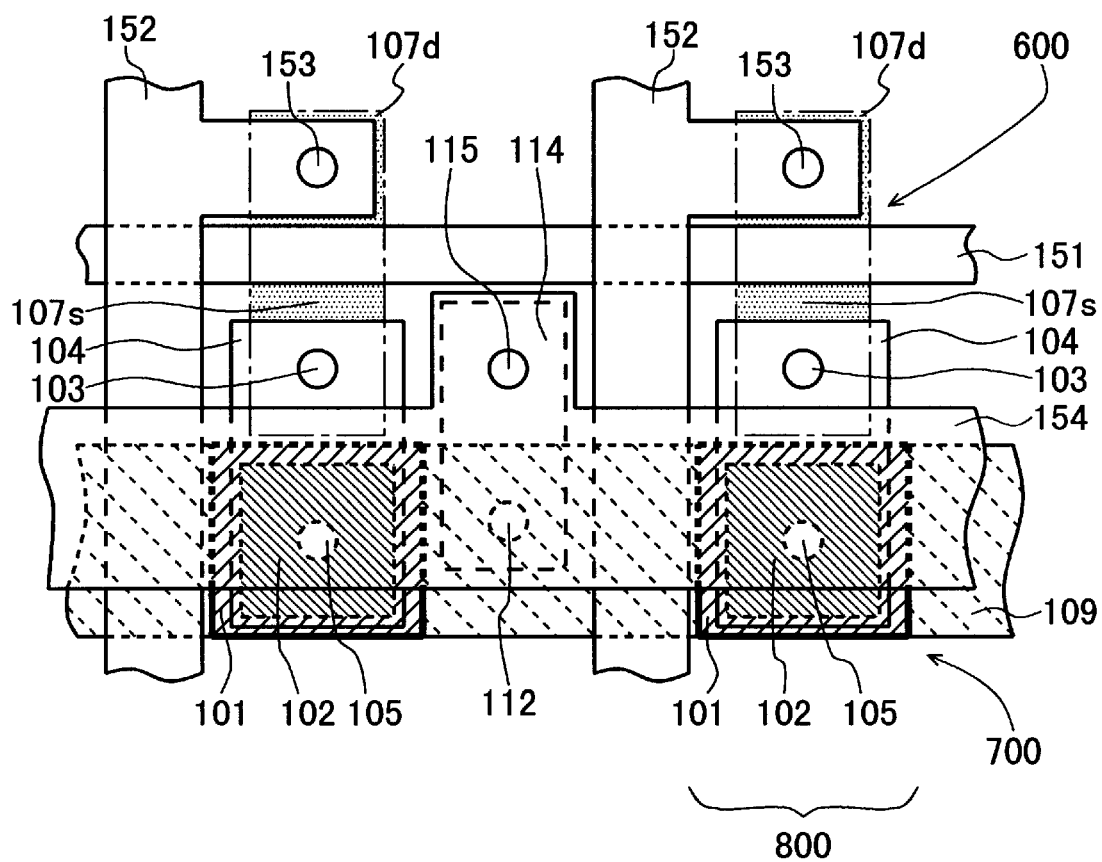
FIG. 1 shows a memory cell structure of a conventional semiconductor memory device.

Preferred embodiments of the present invention will be described below referring to the drawings attached.

First Embodiment

A semiconductor memory device according to a first embodiment of the present invention has a configuration as shown in FIGS. 4A to 4C and 5, 6, and 7.

Figure 4A:
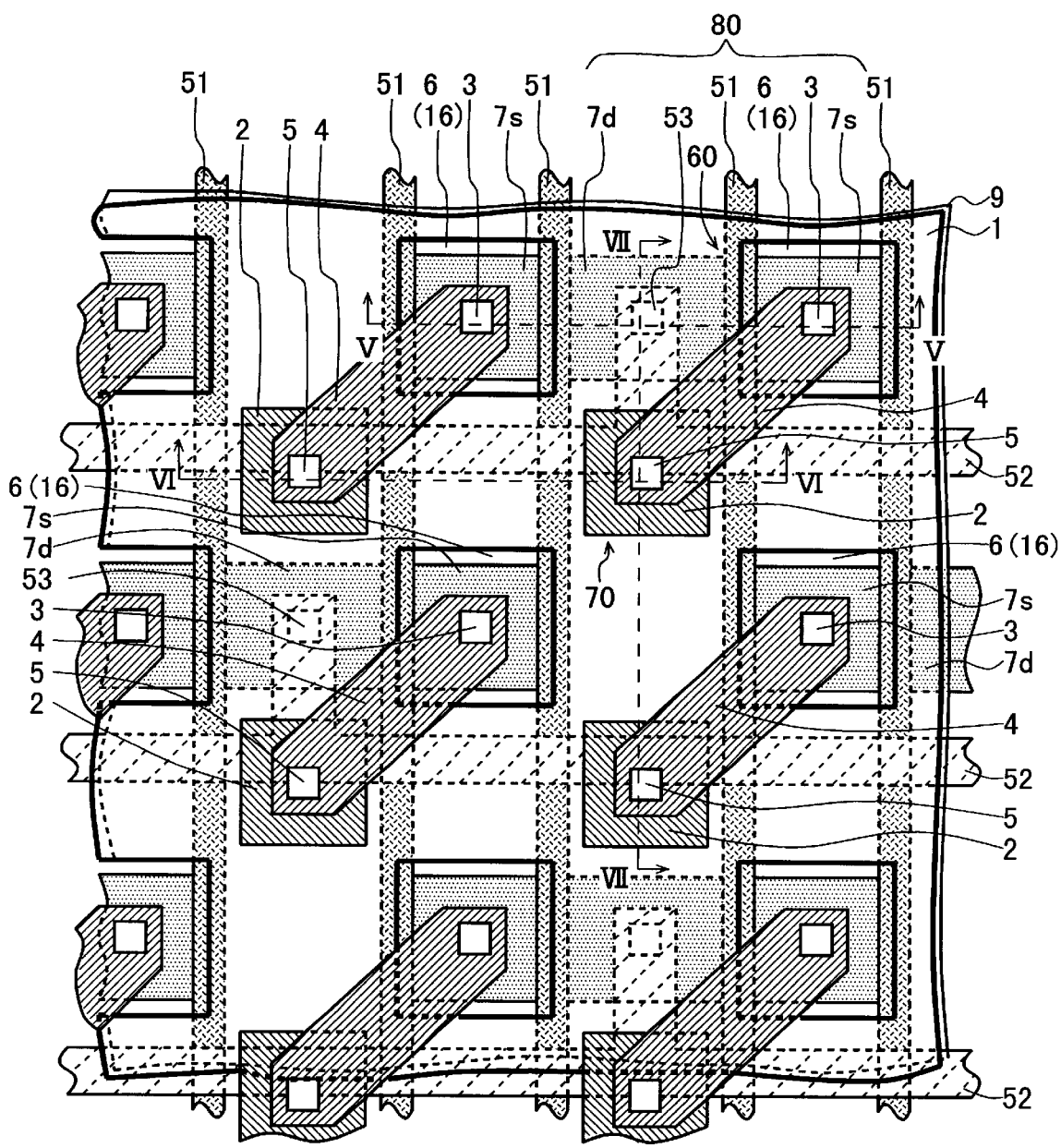
FIG. 4A shows a memory cell layout of a semiconductor memory device according to a first embodiment of the present invention.
Figure 4B:
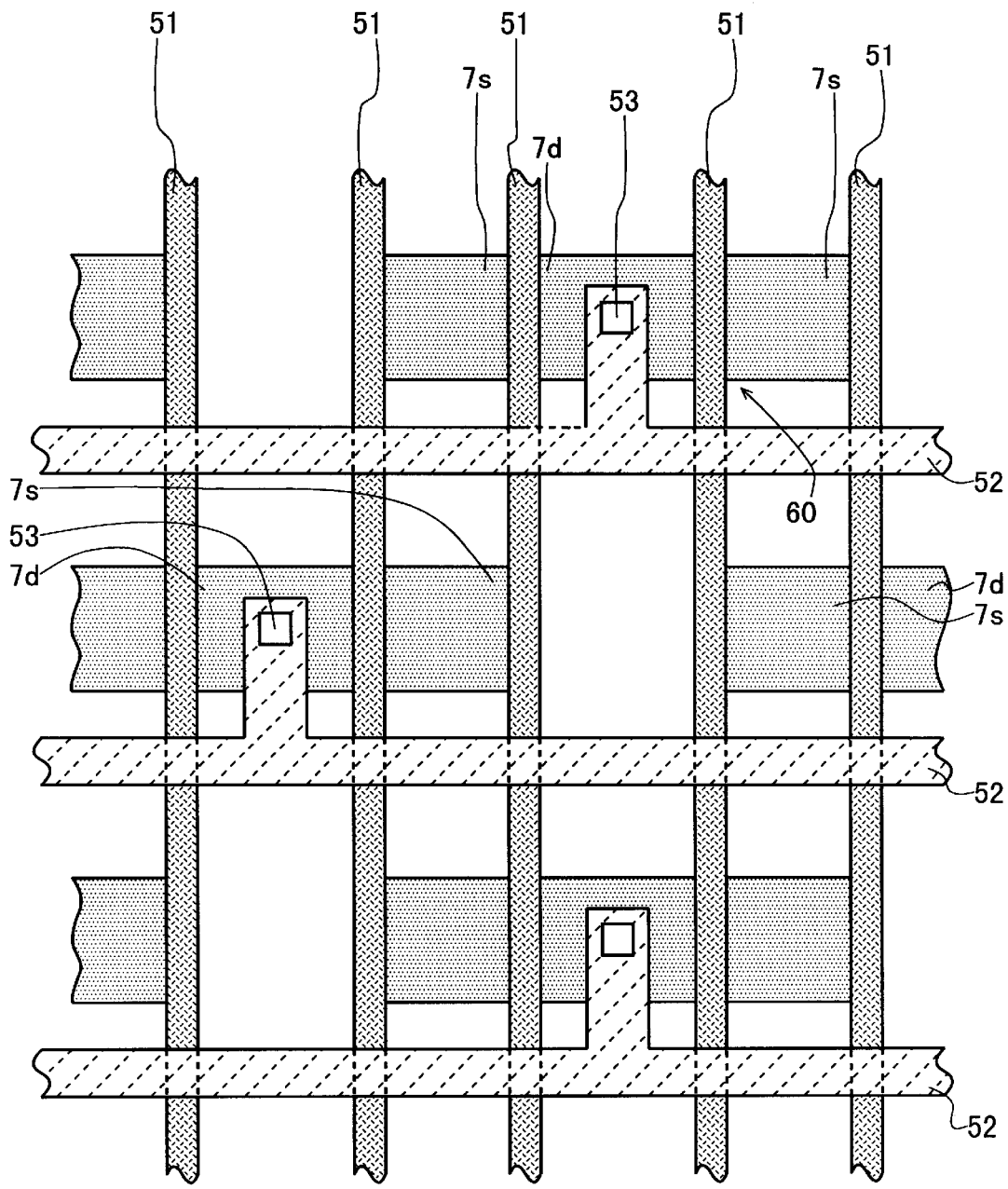
FIG. 4B shows a layout of the source and drain regions and the gate electrodes of the select MOSFETs of the semiconductor memory device according to the first embodiment.
Figure 4C:
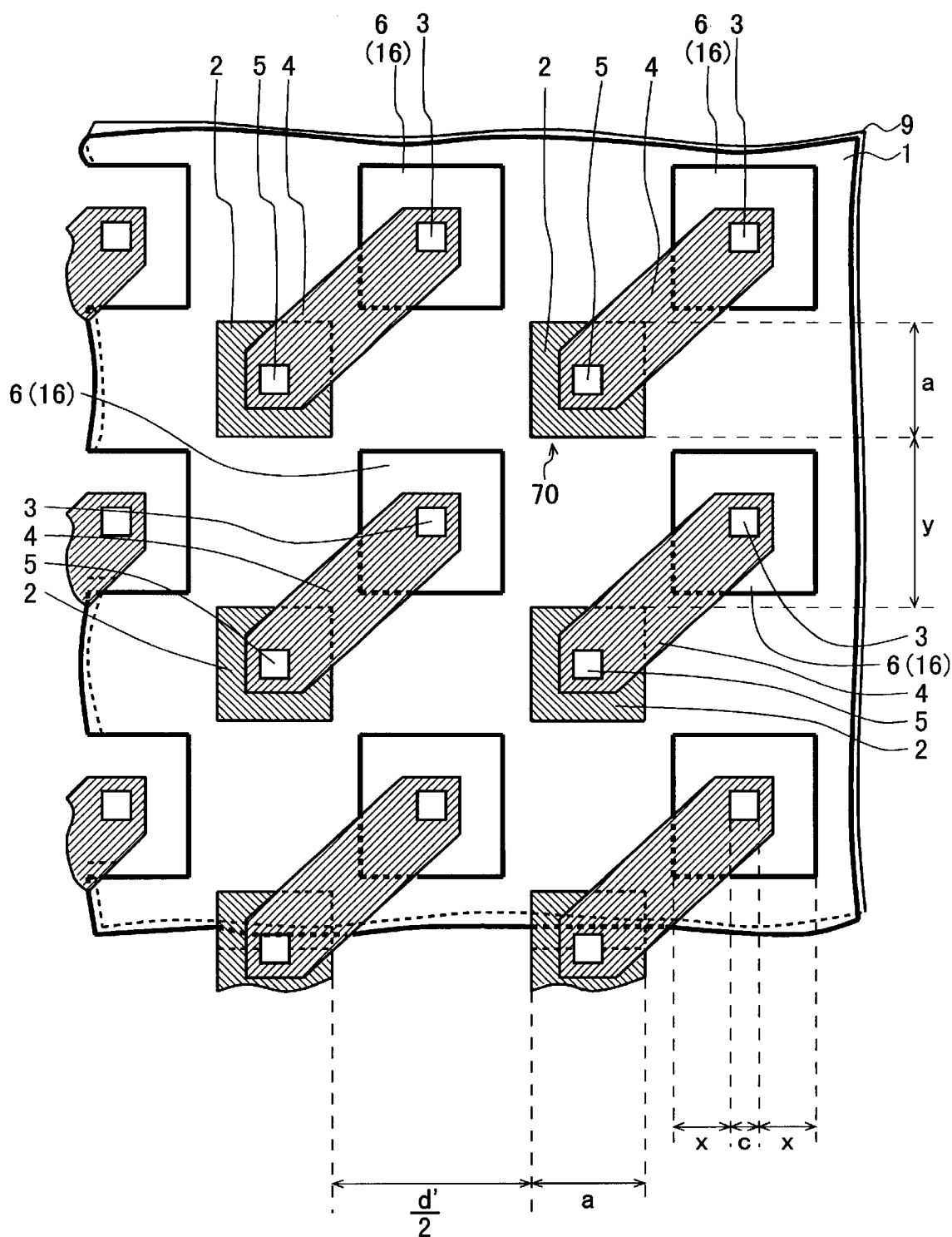
FIG. 4C shows a layout of the lower and upper electrodes and the dielectrics of the storage capacitors and the wiring lines of the semiconductor memory device according to the first embodiment.
Figure 5:
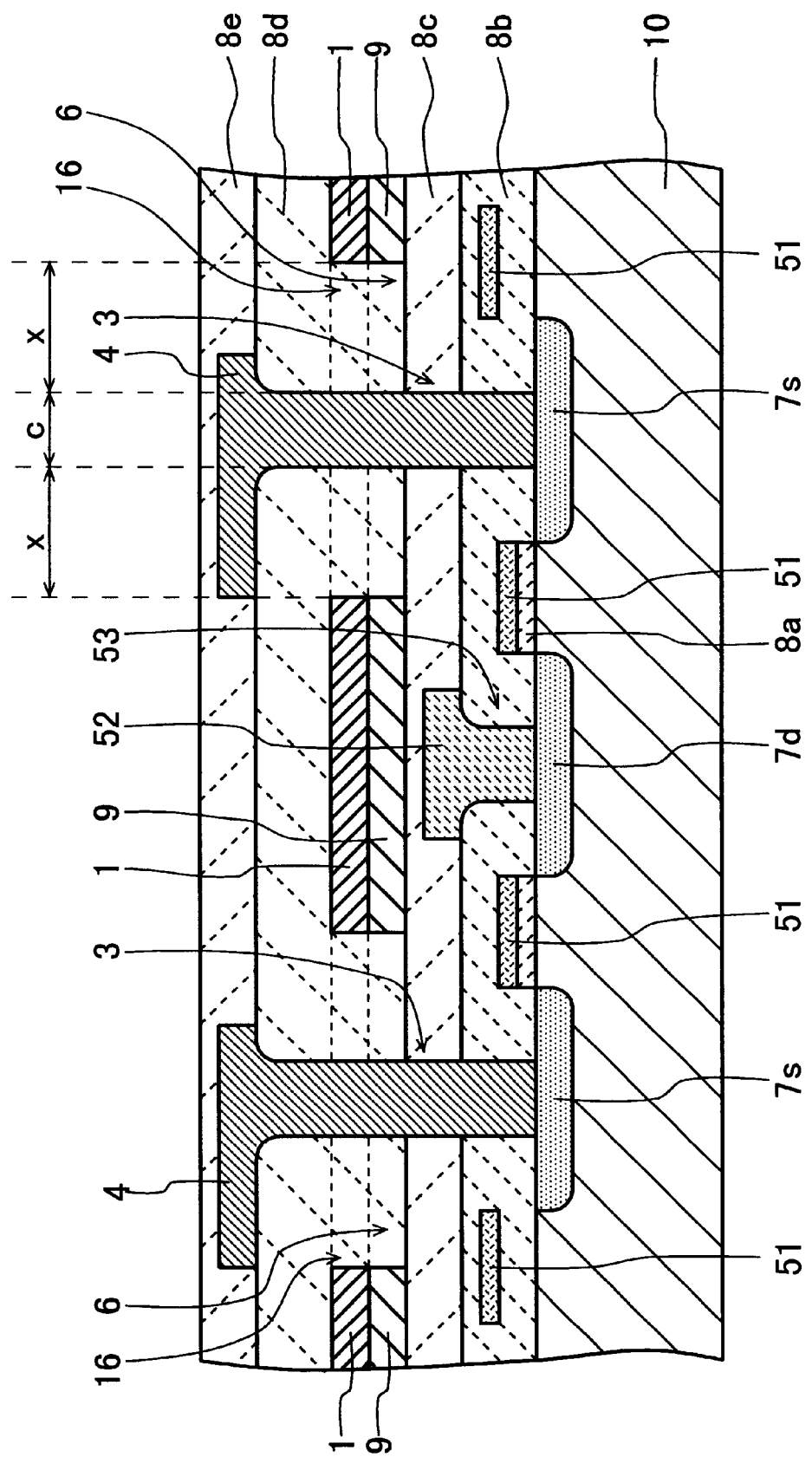
FIG. 5 shows a cross section along the line V—V in FIG. 4A.

As shown in FIGS. 4A, 4B, and 4C, this semiconductor memory device has a lot of memory cells with a same structure, which are arranged in a matrix array.

Each of the memory cells has a MOSFET 60 serving as a select transistor and a storage capacitor 70 for electric-charge storing.

Source and drain regions 7s and 7d of the MOSFETs 60 are regularly formed in a semiconductor substrate 10. Gate electrodes 51 are regularly formed over the substrate 10 through gate oxide layers 8a. The gate electrodes 51 serve as word lines electrically connecting the corresponding gate electrodes 51 to one another.

The drain regions 7d are electrically connected to overlying, corresponding bit lines 52 through contact holes 53 penetrating an interlayer insulating layer 8b.

The source regions 7s are electrically connected to overlying, corresponding wiring lines 4 through contact holes 3 penetrating the interlayer insulating layer 8b, an interlayer insulating layer 8c, and an interlayer insulating layer 8d. The wiring lines 4 are electrically connected to underlying upper electrodes 2 of the storage capacitors 70 through contact holes 5 penetrating the interlayer insulating 8d. Thus, the source regions 7s are electrically connected to the overlying upper electrodes 2 of the storage capacitors 70.

Bit lines 52 are formed on the interlayer insulating layer 8b. The bit lines 52 are contacted with and electrically connected to the corresponding drain regions 7d through the contact holes 53 penetrating the interlayer insulating layers 8.

Lower electrodes 9 of the storage capacitors 70 are formed by a patterned, common electrically-conductive layer formed on the interlayer insulating layer 8c. The common electrically-conductive layer has square windows 6 arranged at regular intervals along the rows and columns of the matrix array. Since the lower electrodes 9 are formed by the patterned, common electrically-conductive layer, they are applied with a same electric potential on operation.

Dielectrics 1 of the storage capacitors 70 are formed by a patterned, common ferroelectric layer formed on the common electrically-conductive layer constituting the lower electrodes 9. The ferroelectric layer is entirely overlapped with the common electrically-conductive layer constituting the lower electrodes 9. The ferroelectric layer has square windows 16 arranged at regular intervals along the rows and columns of the matrix array, so that the windows 16 are entirely overlapped with the underlying windows 6.

The upper electrodes 2 of the storage capacitors 70, which are square-shaped, are regularly arranged on the common ferroelectric layer constituting The dielectrics 1. The upper electrodes 2 are located outside the rows and columns of the matrix array in which the windows 6 of the common electrically-conductive layer and the windows 16 of the common ferroelectric layer are aligned.

Here, the upper electrodes 2 are located at the positions obliquely shifted by an angle of 45° with respect to the corresponding windows 6 and 16 in the rows or columns of the matrix array.

The ferroelectric layer (i.e., the dielectrics 1) is (are) sandwiched by the lower electrodes 9 and the upper electrodes 2.

Wiring lines 4 are formed over the upper electrodes 2 through the interlayer insulating layer 8d covering the storage capacitors 70. Also, the wiring lines 4 are electrically connected to the upper electrodes 2 through contact holes 5 penetrating the interlayer insulating layer 8d. The wiring lines 4 are electrically connected to the select transistors 60 through the windows 16 of the common ferroelectric layer, the windows 6 of the common electrically-conductive layer, and the contact holes 3 penetrating the interlayer insulating layers 8d, 8c, and 8b.

As clearly seen from FIG. 4A, the wiring lines 4 have an angle of 45° with respect to the rows or columns of the matrix array (or, the bit and word lines 52 and 51). The square windows 6 and 16 are arranged in a matrix array. The square-shaped upper electrodes 2 are arranged at the central positions among the tour adjoining ones of the windows 6 and 16. The upper electrodes 2 are overlapped with the bit lines.

The common electrically-conductive layer constituting the lower electrodes 9 may be made of Pt, Au, Pu, Ir, $Ru_2$, or $IrO_2$, where Pt and Au have high oxidation resistance.

The upper electrodes 2 may be made of a same material as the lower electrodes 9. Alternately, the upper electrodes 2 may be made of a wiring material which have been popularly used in Large-Scale Integrated circuits (LSIs), such as Al, Ti, TiN, W, or Cu.

The common ferroelectric layer constituting the dielectrics 1 may be made of $Pb(Zr,Ti) O_3$ or $SrBi_2Ta_2O_9$.

The wiring lines 4 may be made of a wiring material which have been popularly used in LSIs, such as Al, Ti, TiN, W, or Cu.

Figure 2A:
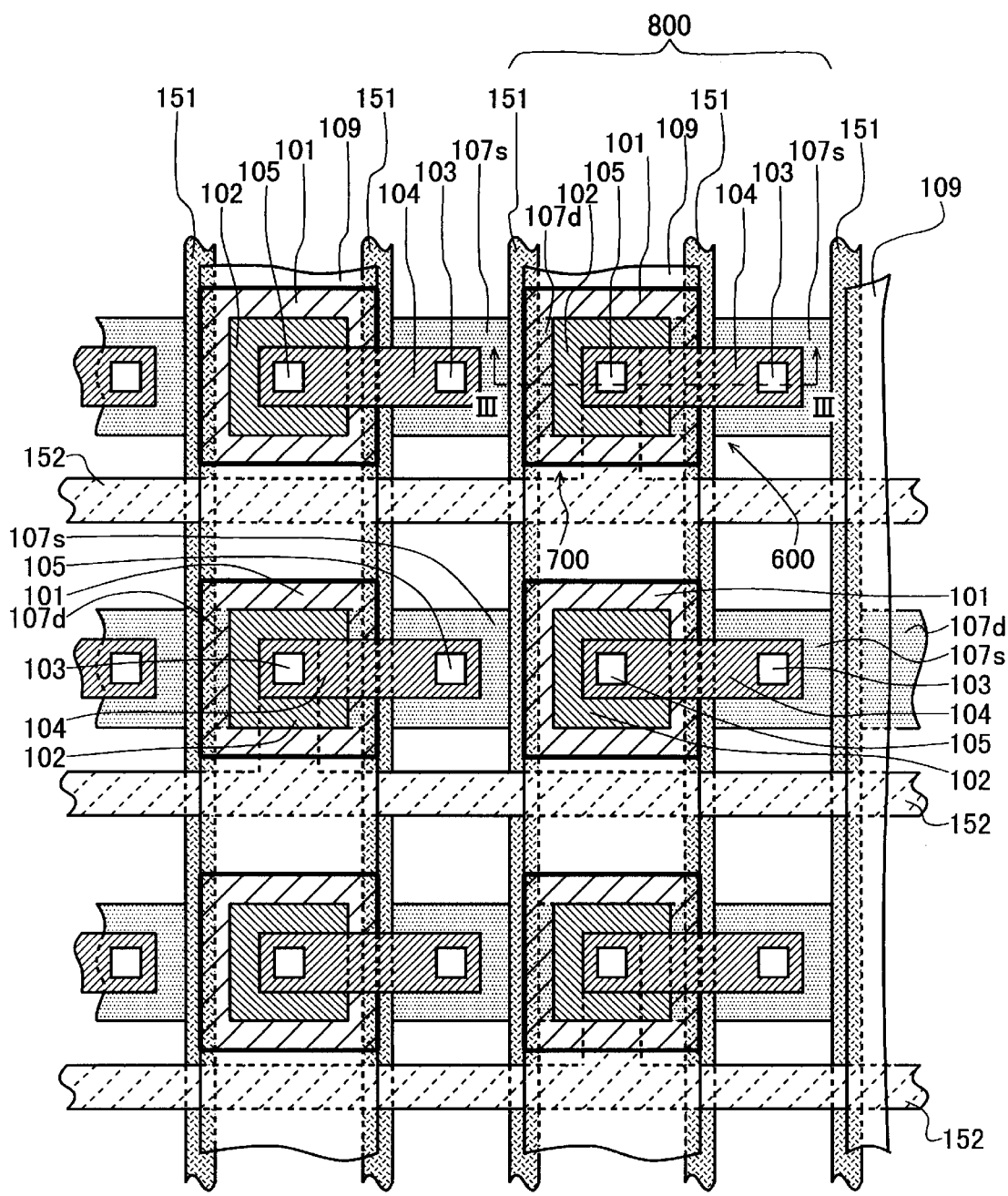
FIG. 2A shows a memory cell layout of another conventional semiconductor memory device, in which the memory cells having substantially the same structure as shown in FIG. 1 are arranged.
Figure 6:
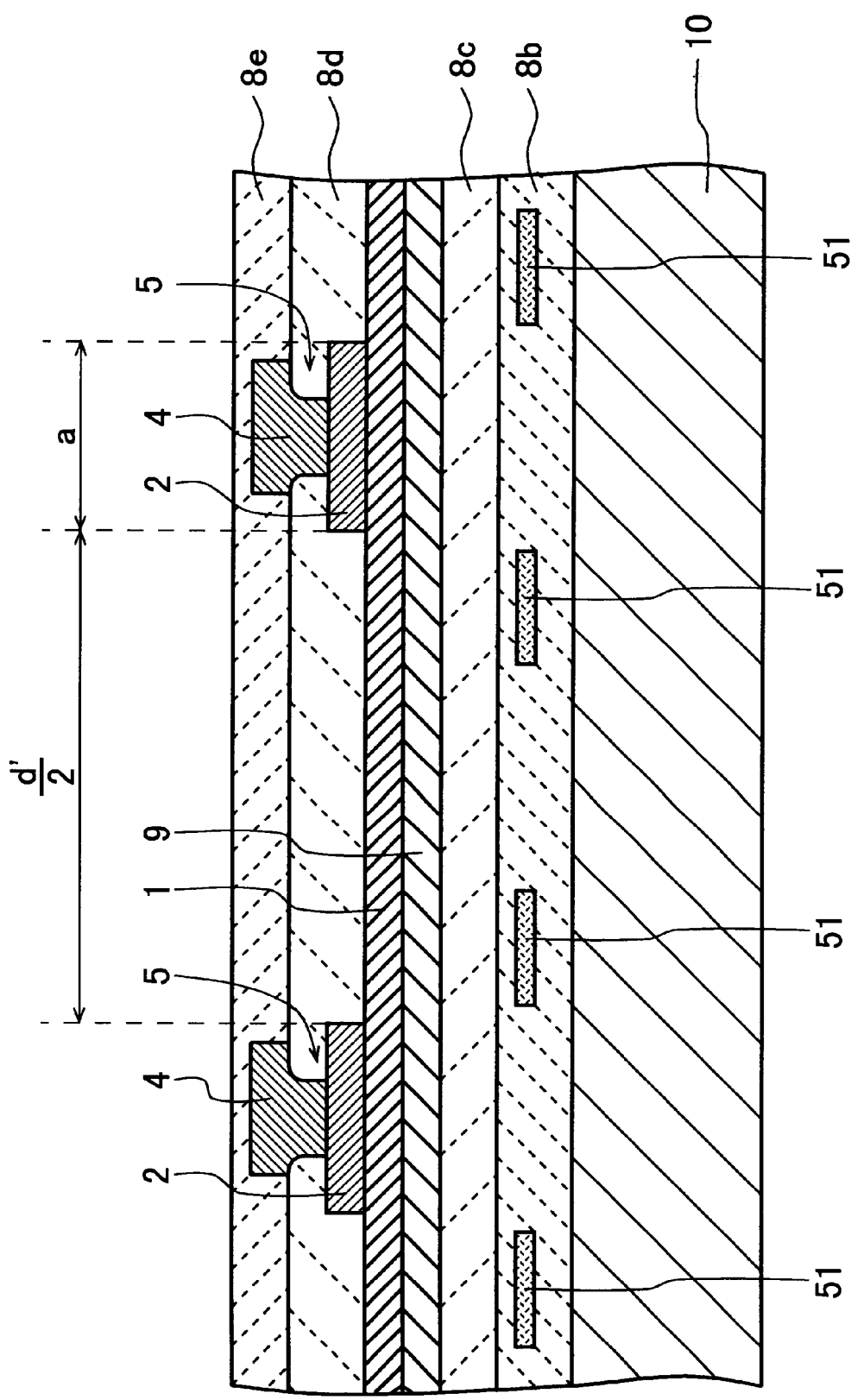
FIG. 6 shows a cross section along the line VI—VI in FIG. 4A.
Figure 7:
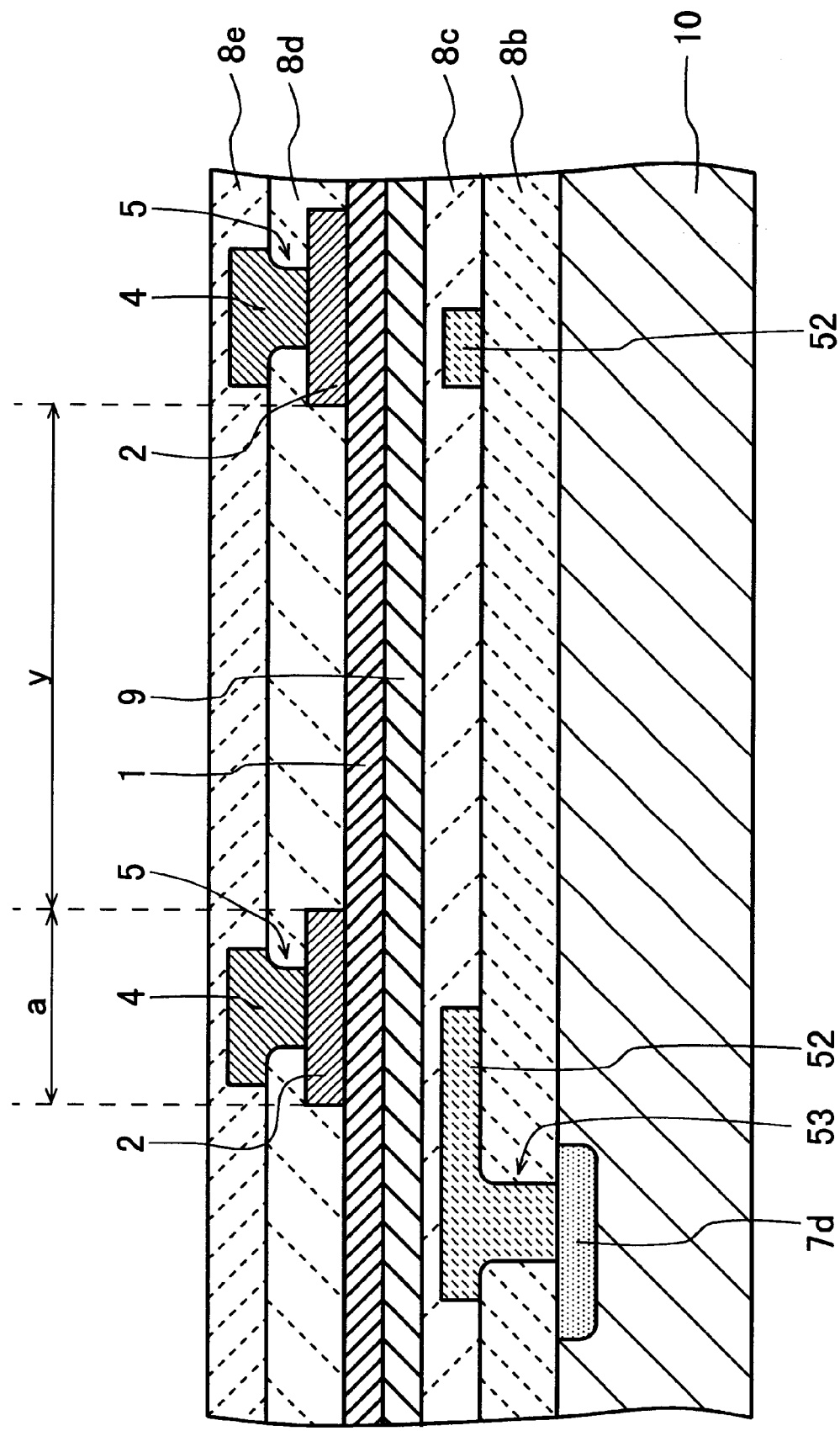
FIG. 7 shows a cross section along the line VII—VII in FIG. 4A.

A size difference d' between the upper electrodes 2 and the corresponding dielectrics 1 is expressed as shown in FIGS. 4C and 6. It is obvious that the difference d' is quite longer the difference d in the conventional semiconductor memory device shown in FIG. 2A.

With the semiconductor memory device according to the first embodiment of the present invention, the lower electrodes 9 are formed by the patterned, common electrically-conductive layer formed on the interlayer insulating layer 8c. The dielectrics 1 of the storage capacitors 70 are formed by the patterned, common ferroelectric layer formed on the common electrically-conductive layer, and they are entirely overlapped with the common electrically-conductive layer.

Further, the upper electrodes 2 are regularly arranged on the common ferroelectric layer, and they are located outside the rows and columns of the matrix array in which the windows 6 of the common electrically-conductive layer and the windows 16 of the common ferroelectric layer are aligned.

Therefore, the size of the upper and lower electrodes 2 and 9 may be optionally determined within a wide range. This means that the size difference d' between the upper and lower electrodes 2 and 9 may be increased as necessary without increasing the chip-area of the memory cells 80. This leads to higher integration of the memory cells 80.

On the other hand, if a parasitic capacitance of the lower electrodes 9 with respect to a specific electrically-conductive line which is subjected to a large electric-potential change is sufficiently smaller than a parasitic capacitance of the lower electrodes 9 with respect to the remaining electrically-conductive lines which are subjected to no electric-potential change, electric-potential change of the lower electrodes 9 may be suppressed in spite of the large electric-potential change of the specific electrically-conductive line.

In the device according to the first embodiment, because the lower electrodes 9 are formed by the patterned, common electrically-conductive layer, a same electric potential is applied to the lower electrodes 9 on operation. Thus, the parasitic capacitance of the lower electrodes 9 with respect to the remaining electrically-conductive lines becomes large. As a result, the electric-potential change of the lower electrodes 9 is suppressed in spite of the large electric-potential change of the specific electrically-conductive line. This means that the semiconductor memory device according to the first embodiment has improved reliability.

Figure 2C:
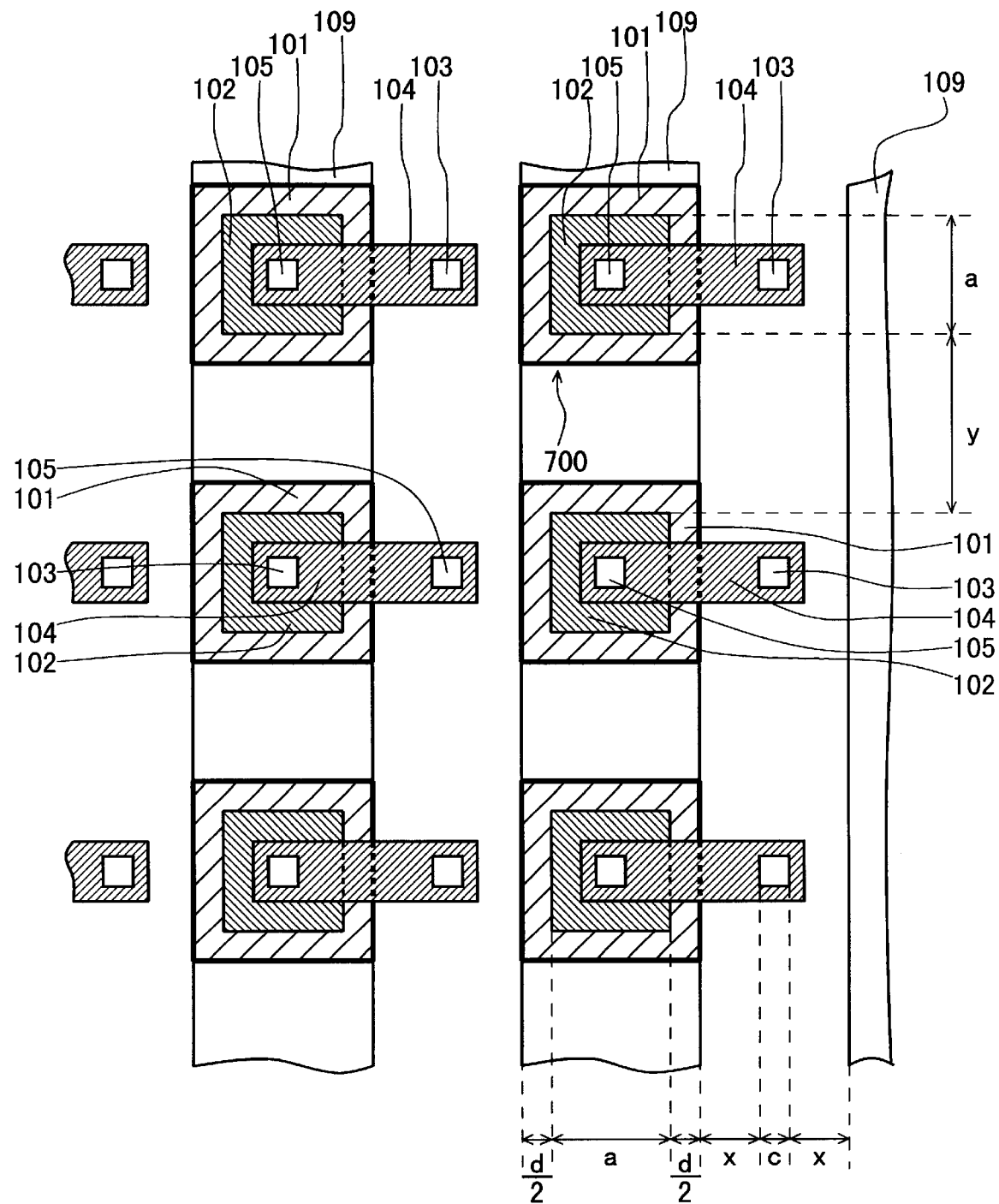
FIG. 2C shows a layout of the lower and upper electrodes and the dielectrics of the storage capacitors and the wiring lines of the conventional semiconductor memory device shown in FIG. 2A.
Figure 3:
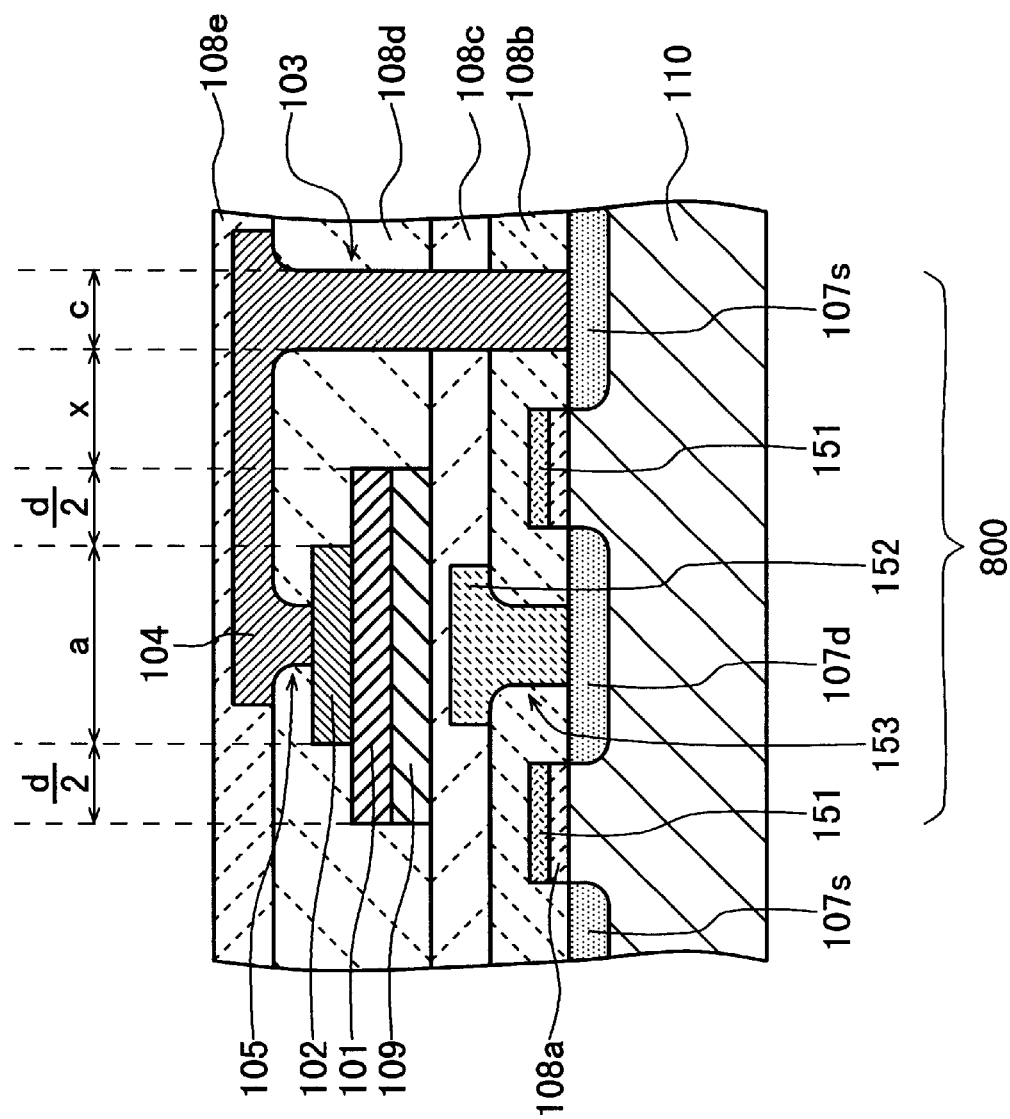
FIG. 3 shows a cross section along the line III—III in FIG. 2A.

In the previously-explained conventional semiconductor memory device shown in FIGS. 2 and 3, when the size difference d between the upper and lower electrodes 102 and 109 is set as 0.2 μm, and a=2.0 μm, x=0.6 μm, c=0.9 μm², and y=2.0 μm², the chip area Sc is given as 17.2 μm². On the other hand, when the difference d is increased to 1.0 μm, the chip area sc is increased to 20.4 μm².

However, in the semiconductor memory device according to the first embodiment, the size difference d' between the upper and lower electrodes 2 and 9 may be increased to 1.0 μm or more while keeping the chip area Sc as 17.2 μm². This means that the chip area Sc of the memory cell 80 can be decreased.

Moreover, in the semiconductor memory device according to the first embodiment, because the lower electrodes 9 are formed by the patterned electrically-conductive layer having the square windows 6, the parasitic capacitance of the lower electrodes 9 with respect to the remaining electrically-conductive lines except for the lower electrodes 9 is given by multiplying a parasitic capacitance value of 50 (pF/column) by the number of columns of the lower electrodes 9. For example, the number of columns of the lower electrodes 9 is 512, the total parasitic capacitance is equal to 25.6 pF.

Additionally, the interconnection parts between the respective columns generate a parasitic capacitance. Therefore, when a specific electrically-conductive line located in the vicinity of the lower electrodes 9 is subjected to a large electric-potential change of 5 V, the electric-potential fluctuation or deviation of the lower electrodes 9 is equal to approximately 0.1 mV, where $$5 \text{ V} \cdot (0.6 \text{ fF}/25.6 \text{ pF}) \approx 0.1 \text{ mV}.$$

This value of 0.1 mV is quite smaller than the value of 60 mV in the conventional semiconductor memory device,

Second Embodiment

FIGS. 8A and 8B, and FIGS. 9 and 10 show a semiconductor memory device according to a second embodiment of the present invention. This semiconductor memory device has the same configuration as the first embodiment except that the windows 6 of the lower electrodes 9 and the windows 16 of the dielectrics 1 have a same linear or strip-like shape extending along the columns of the matrix (i.e., the word lines 51).

Therefore, the explanation about the same configuration is omitted here by attaching the same reference numerals to the same or corresponding parts or elements in FIGS. 8A to 8C and 9 and 10 for the sake of simplification of description.

Figure 8A:
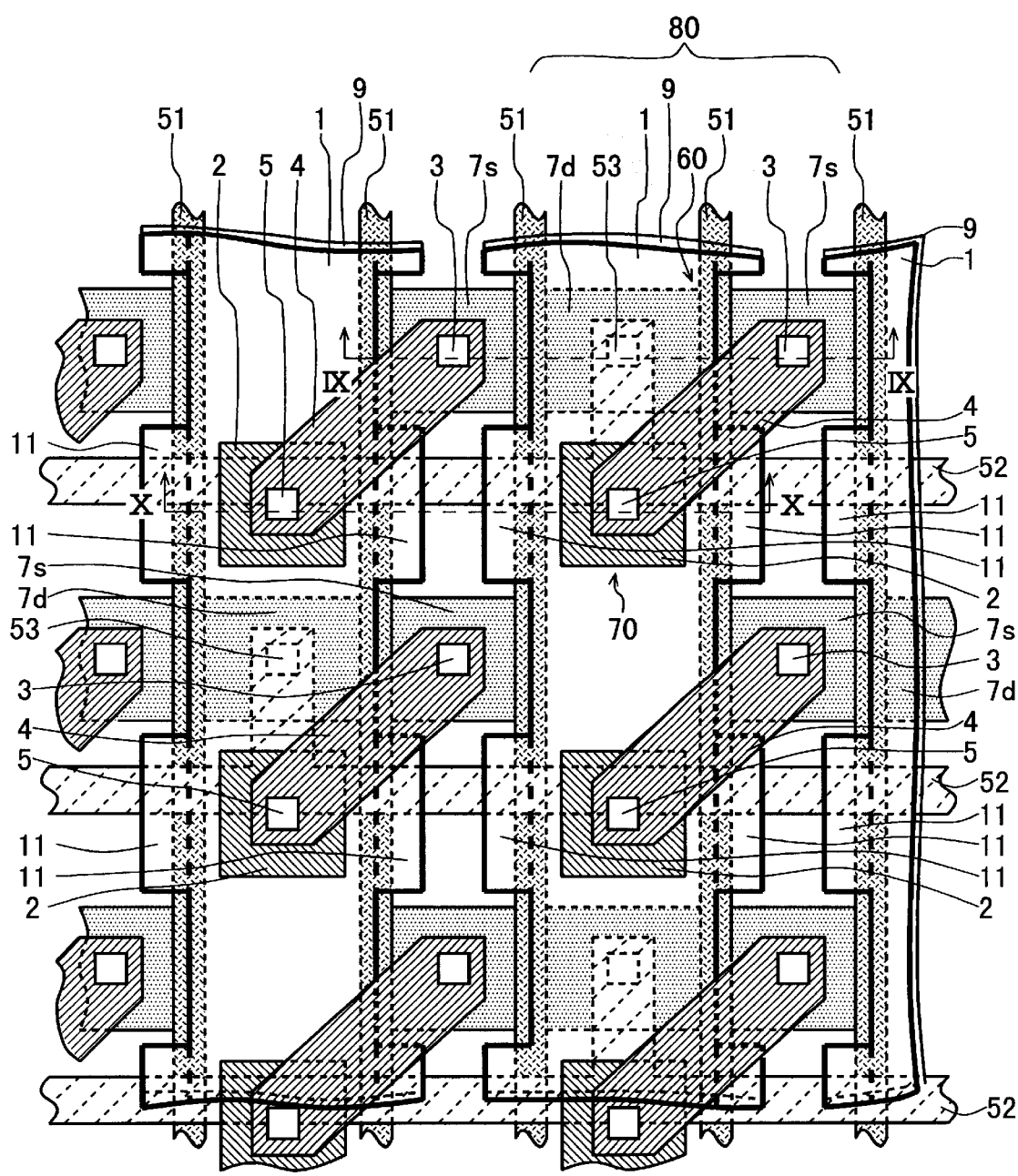
FIG. 8A shows a memory cell layout of a semiconductor memory device according to a second embodiment of the present invention.
Figure 8B:
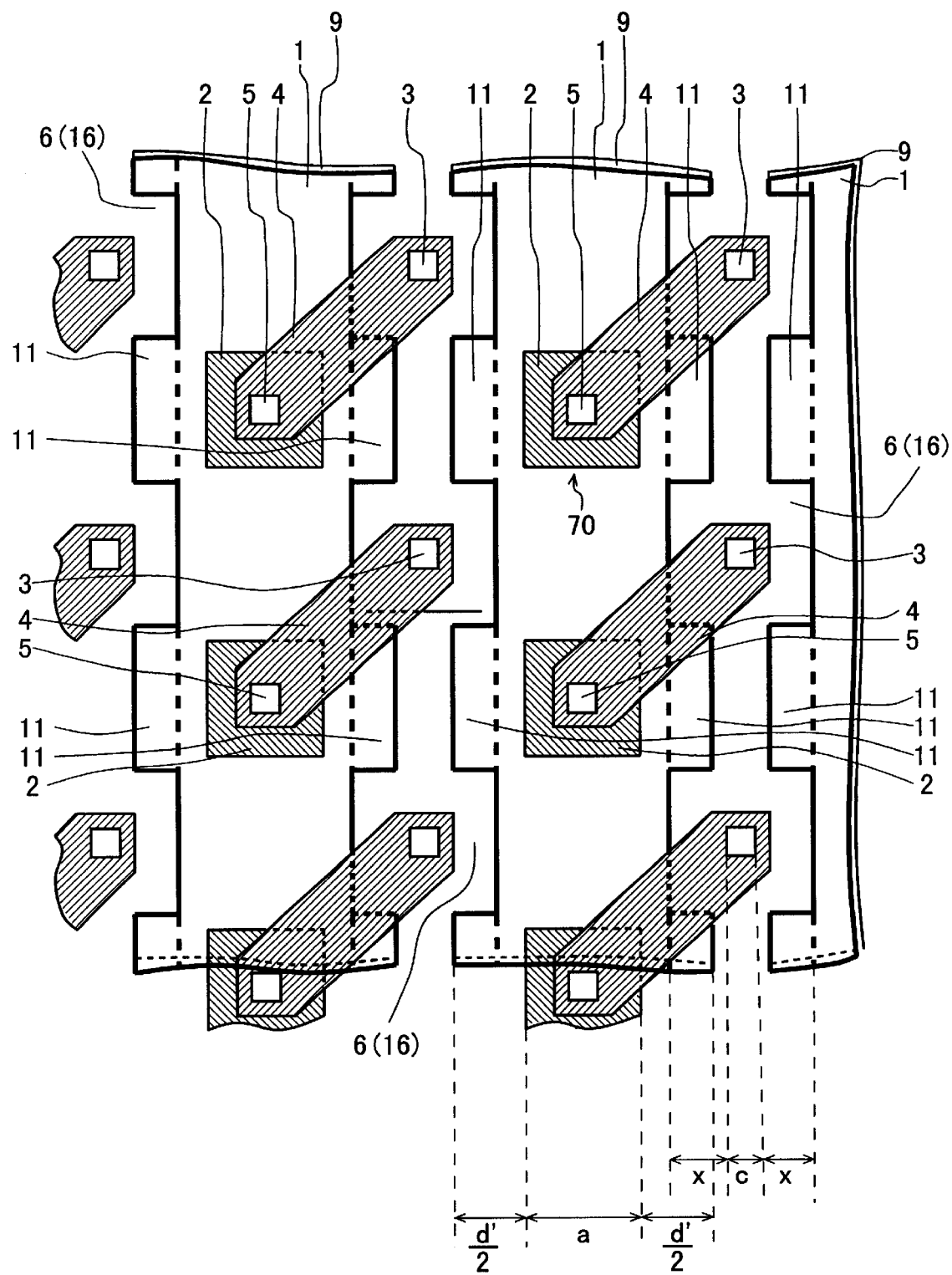
FIG. 8B shows a layout of the lower and upper electrodes and the dielectrics of the storage capacitors and the wiring lines of the semiconductor memory device according to the second embodiment.
Figure 9:
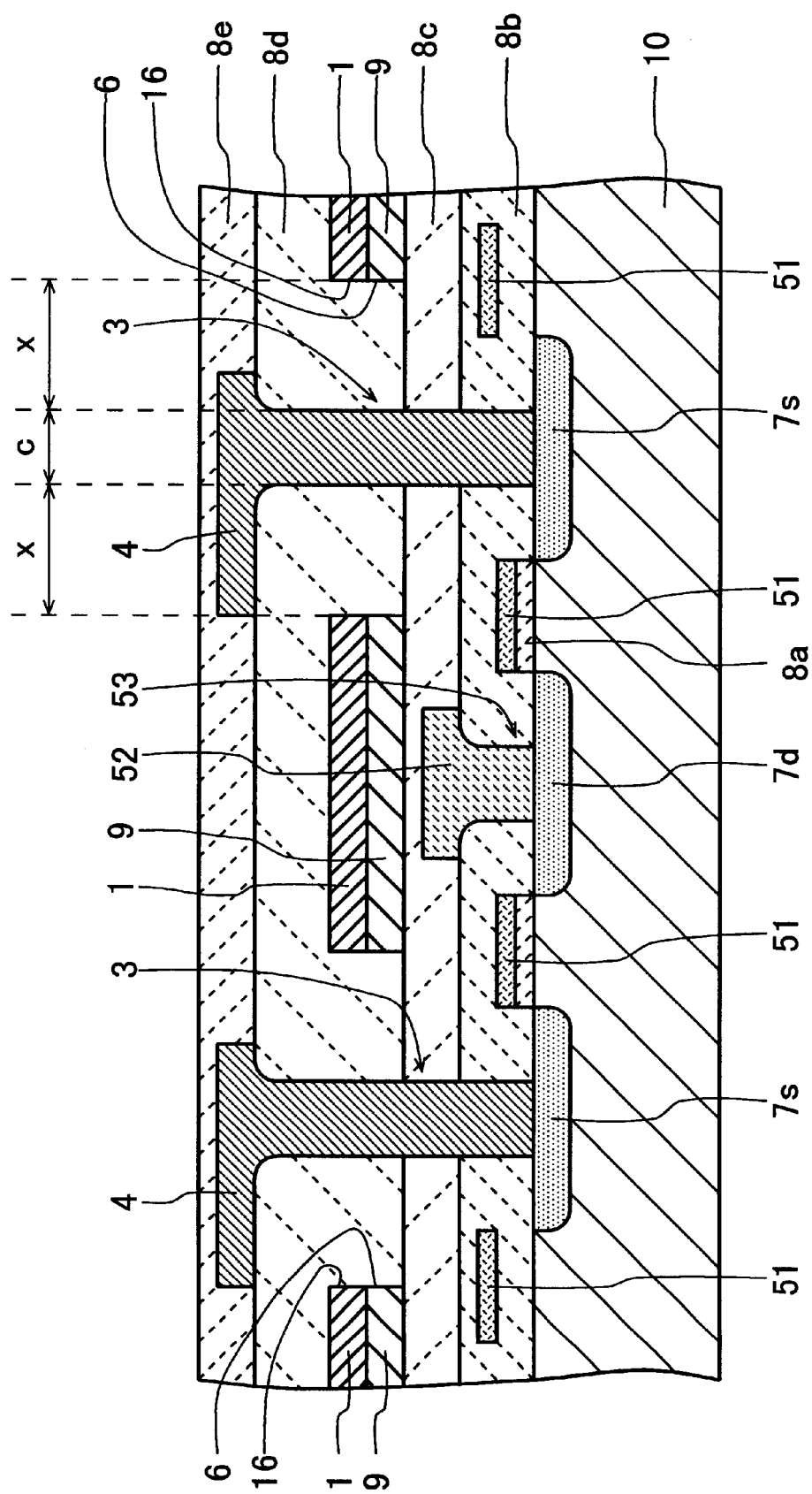
FIG. 9 shows a cross section along the line IX—IX in FIG. 8A.

As clearly seen from FIGS. 8A and 8B, the width of the lower electrodes 9 is slightly increased in the vicinity of the upper electrodes 2.

The layout of the MOSFETs 600 is the same as the first embodiment shown in FIG. 4B. The strip-shaped dielectrics 1 are applied with a same electric potential on operation.

There are the same advantages as those in the first embodiment.

Third Embodiment

Figure 11A:
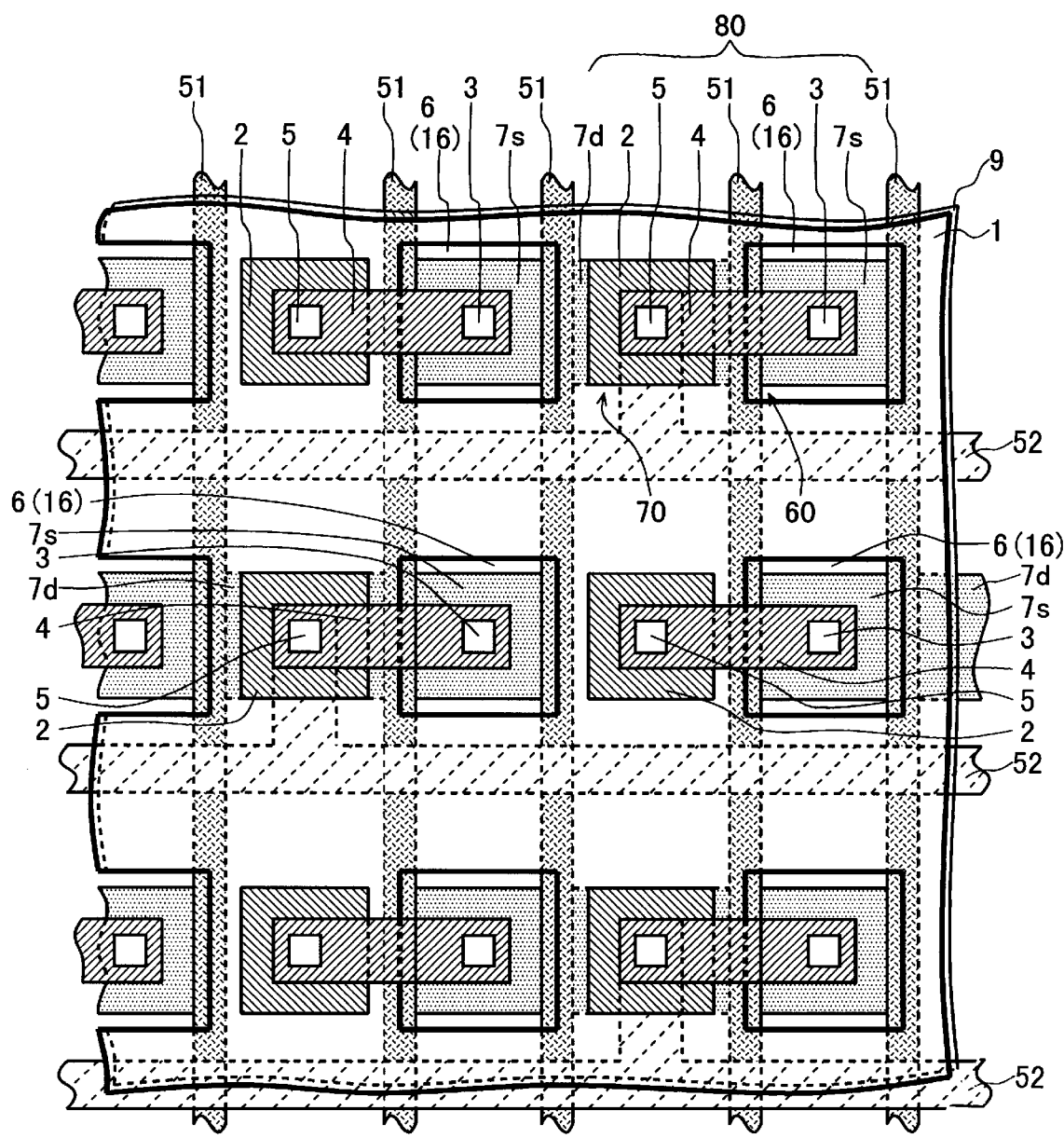
FIG. 11A shows a memory cell layout of a semiconductor memory device according to a third embodiment of the present invention.
Figure 11B:
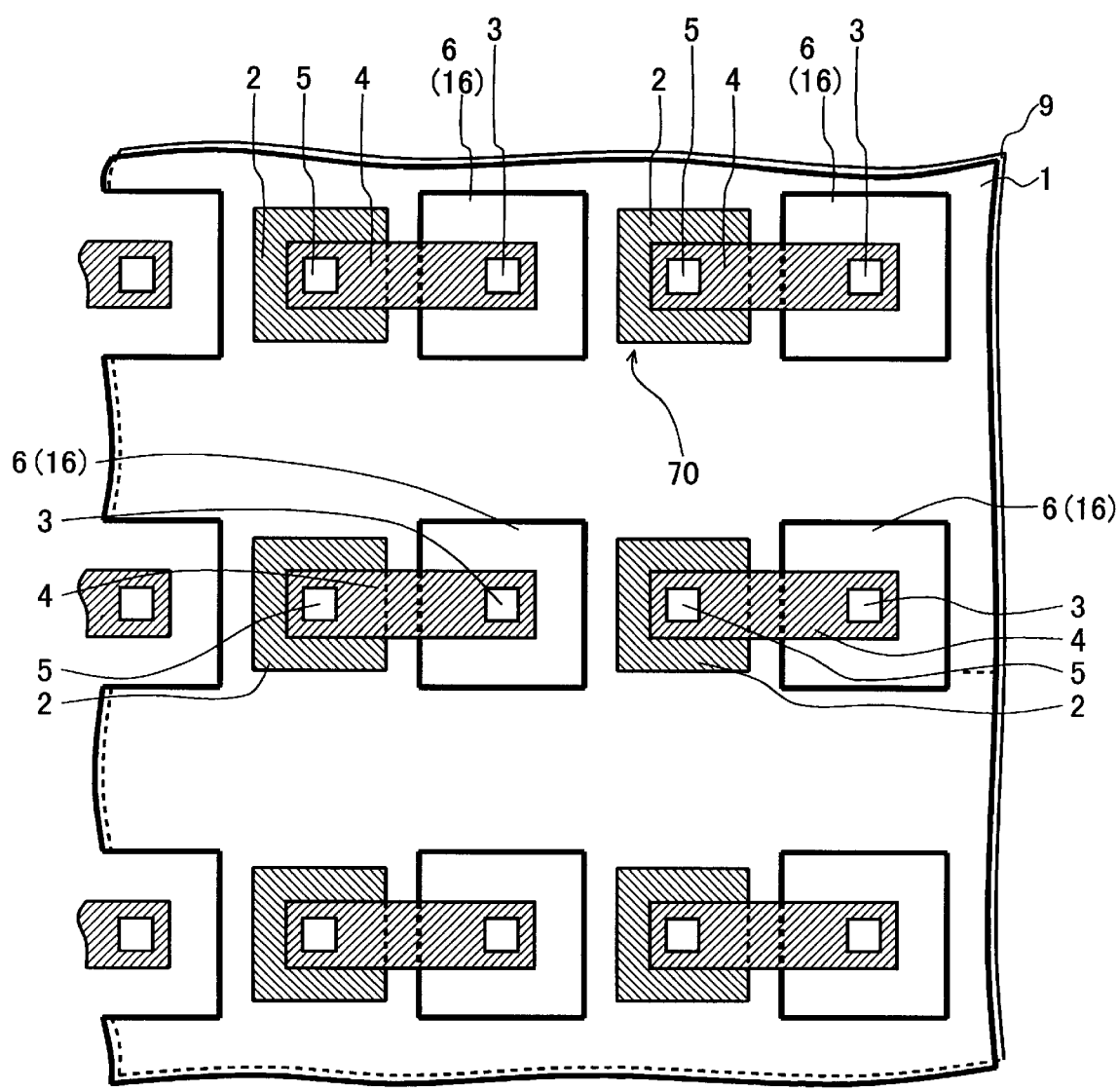
FIG. 11B shows a layout of the lower and upper electrodes and the dielectrics of the storage capacitors and the wiring lines of the semiconductor memory device according to the third embodiment.

FIGS. 11A and 11B show a semiconductor memory device according to a third embodiment of the present invention. This semiconductor memory device has the same configuration as the first embodiment except that the upper electrodes 2 are arranged in the rows or columns of the matrix array in which the windows 6 and 16 are located.

Therefore, the explanation about the same configuration is omitted here by attaching the same reference numerals to the same or corresponding parts or elements a FIGS. 11A and 11B for the sake of simplification of description.

The wiring lines 4 extend along the bit lines 52. The wiring lines 4 may be formed to extend along the word lines 51.

It is needless to say that there are the same advantages as those in the first embodiment.

Fourth Embodiment

Figure 12A:
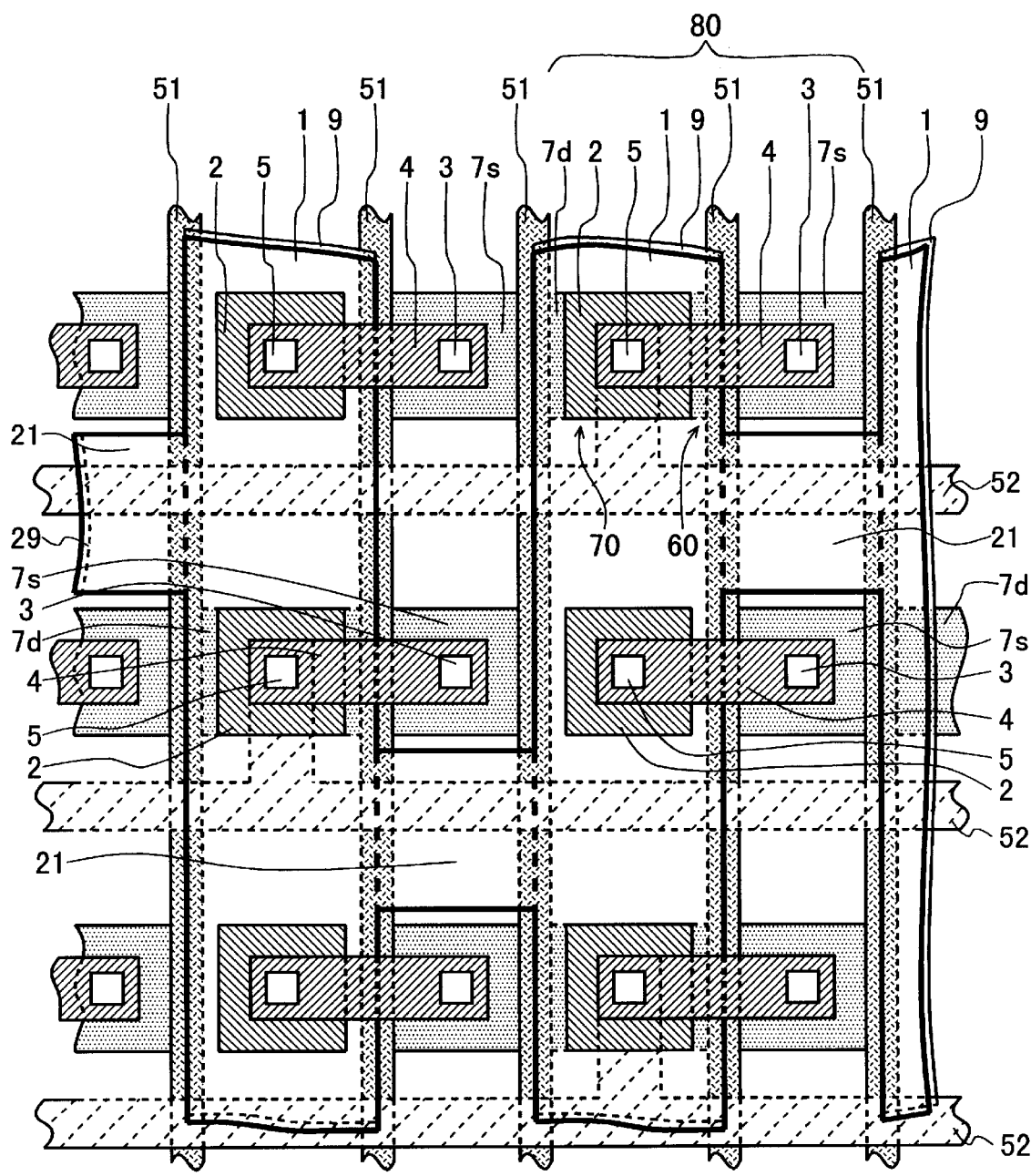
FIG. 12A shows a memory cell layout of a semiconductor memory device according to a fourth embodiment of the present invention.
Figure 12B:
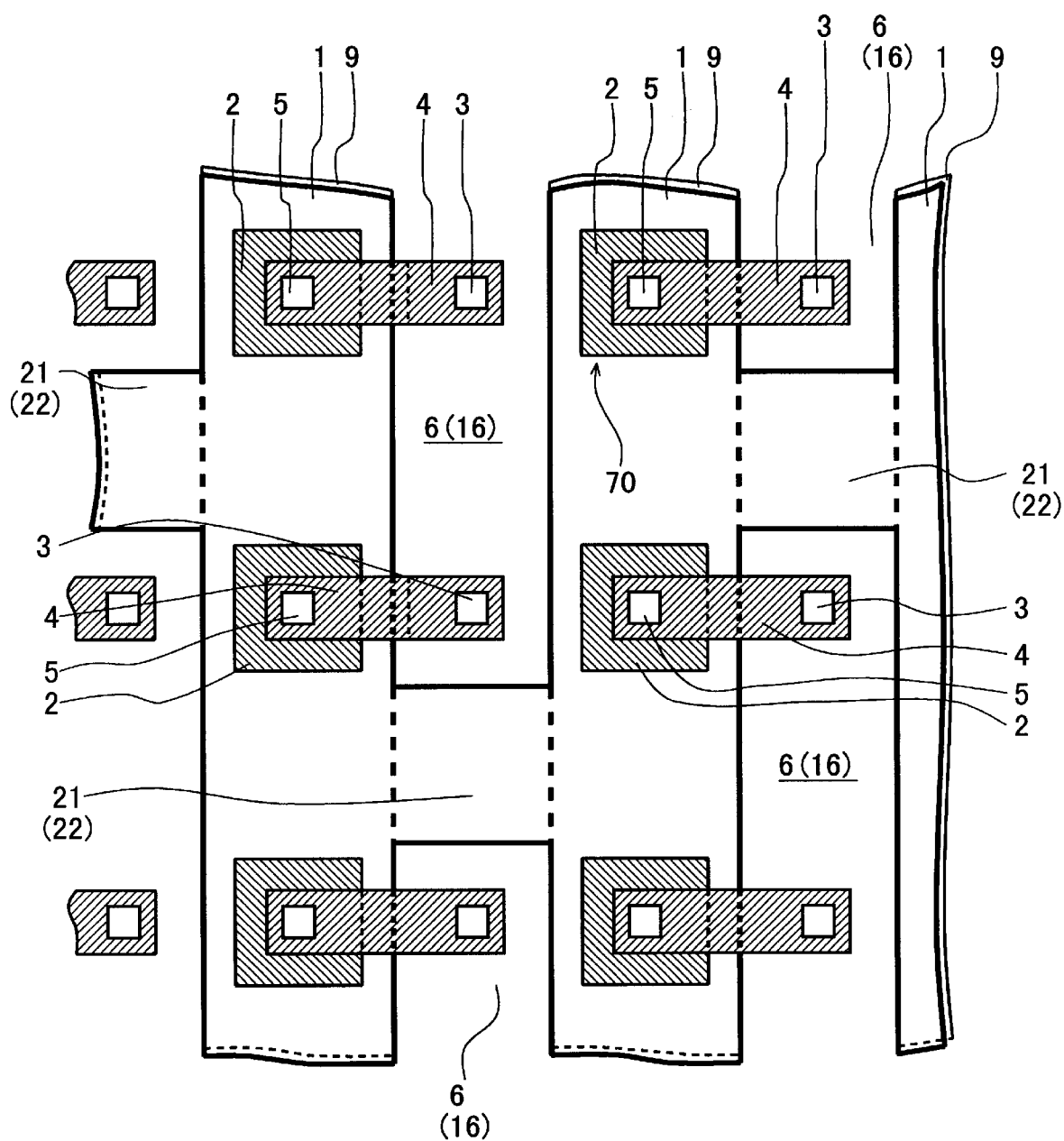
FIG. 12B shows a layout of the lower and upper electrodes and the dielectrics of the storage capacitors and the wiring lines of the semiconductor memory device according to the fourth embodiment.

FIGS. 12A and 12B show a semiconductor memory device according to a fourth embodiment of the present invention. This semiconductor memory device has the same configuration as the third embodiment except that the windows 6 and 16 have a linearly-extending (or, strip-like) shape, and that the windows 6 and 16 are divided by interconnection parts 21 of the lower electrodes 9 and interconnection parts 22 of the dielectrics 1.

Therefore, the explanation about the same configuration is omitted here by attaching the same reference numerals to the same or corresponding parts or elements in FIGS. 12A and 12B for the sake of simplification of description.

The upper electrodes 2 may be located at any position if they are overlapped with the corresponding dielectrics 1 and the lower electrodes 9.

It is needless to say that there are the same advantages as those in the first embodiment.

Fifth Embodiment

Figure 13A:
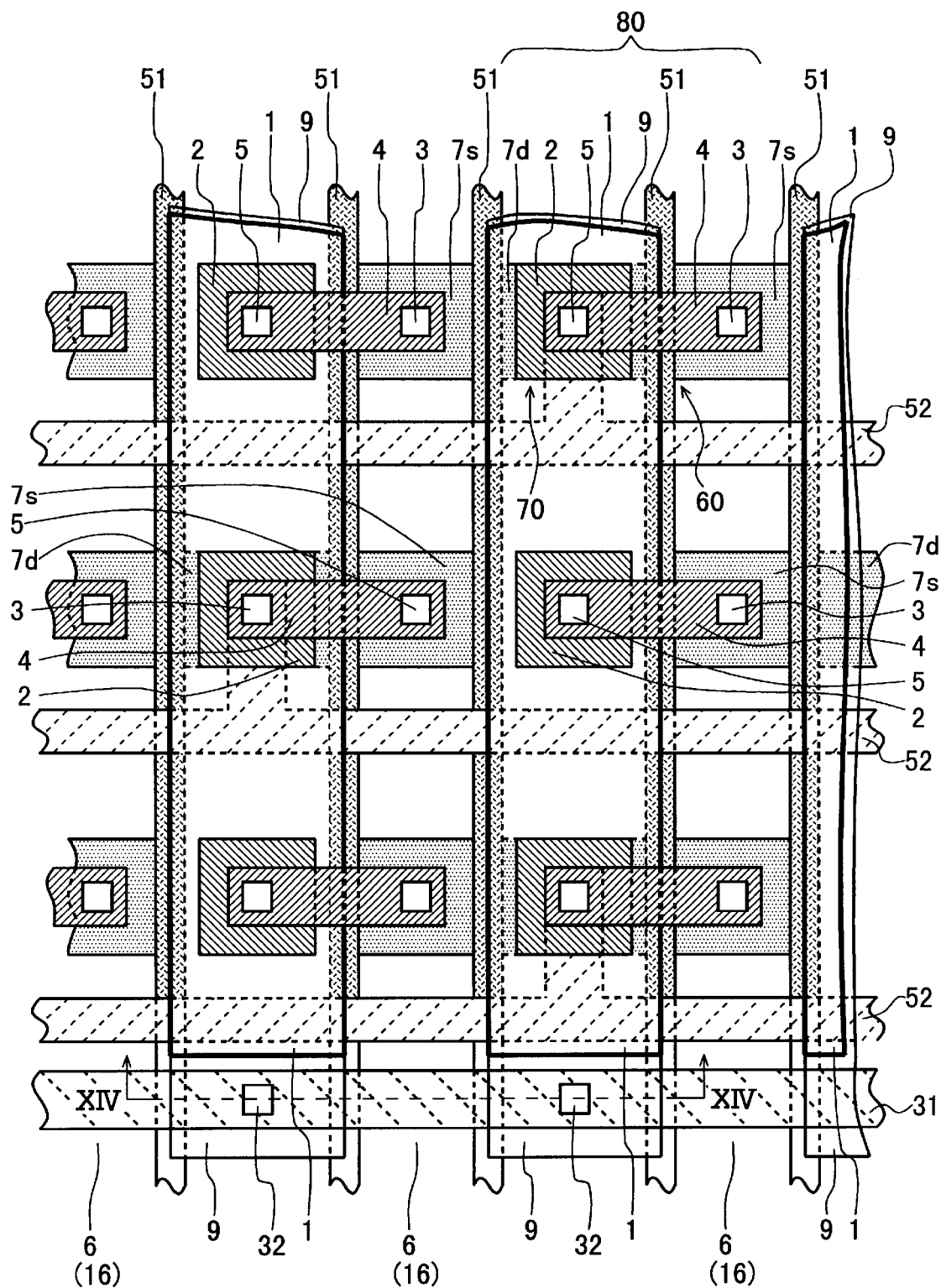
FIG. 13A shows a memory cell layout of a semiconductor memory device according to a fourth embodiment of the present invention.
Figure 13B:
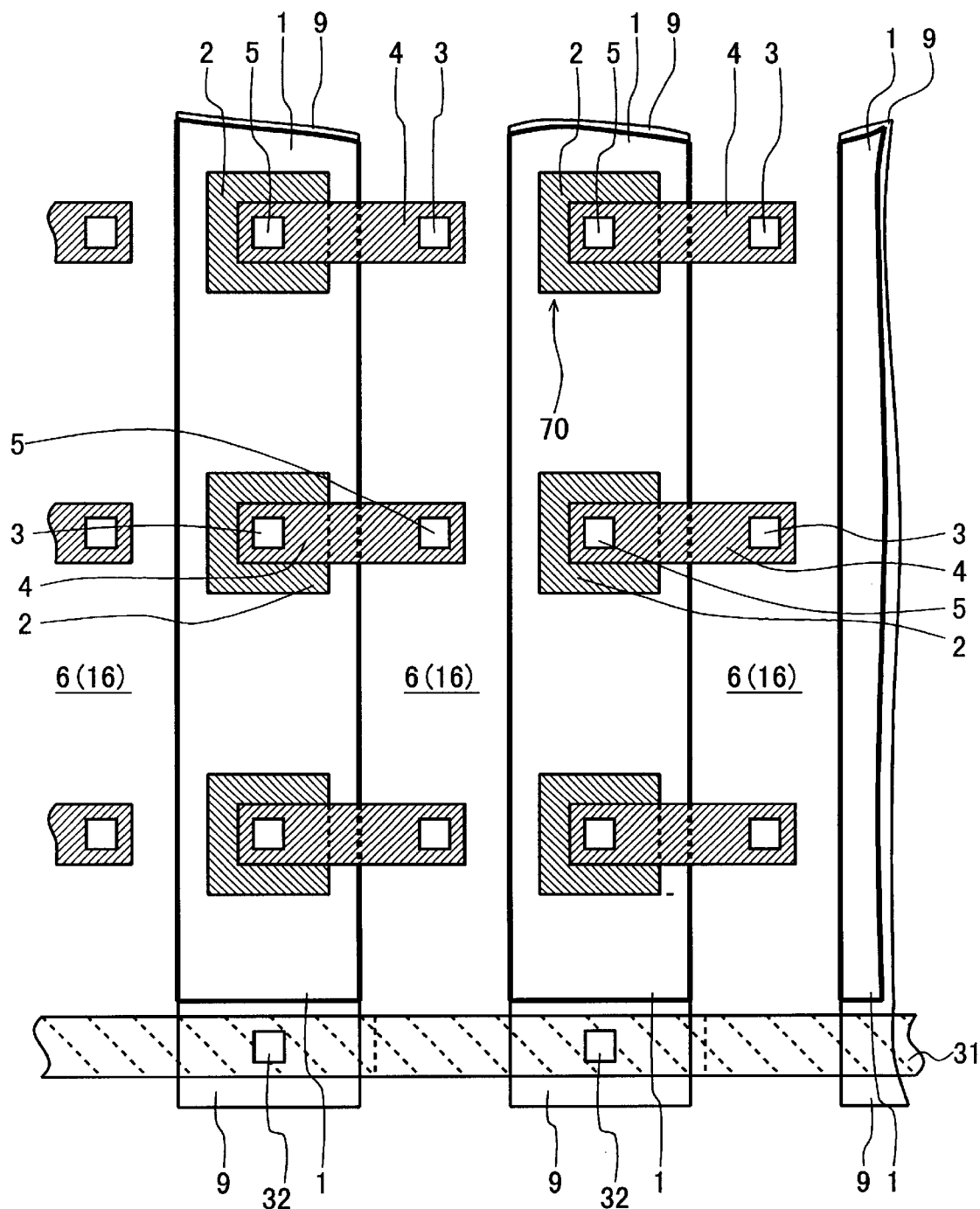
FIG. 13B shows a layout of the lower and upper electrodes and the dielectrics of the storage capacitors and the wiring lines of the semiconductor memory device according to the fourth embodiment.
Figure 14:
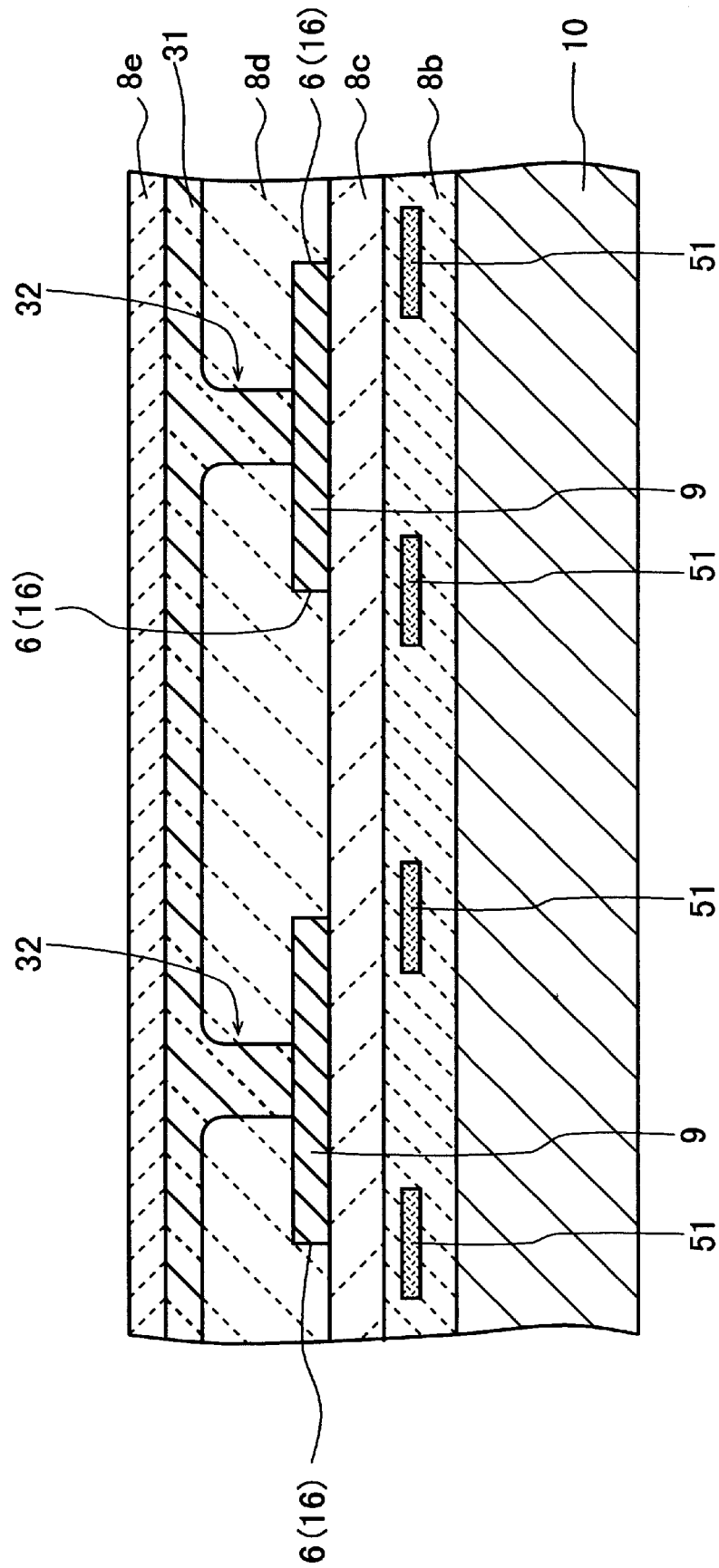
FIG. 14 shows a cross section along the line XIV–XIV in FIG. 13A.

FIGS. 13A and 13B and FIG. 14 show a semiconductor memory device according to a fifth embodiment of the present invention. This semiconductor memory device has the same configuration as the fourth embodiment except that the windows 6 and 16 are formed to divide the common electrically-conductive layer and the common ferroelectric layer into strip-shaped parts. In other words, the windows 6 and 16 extends from one end of the matrix array to an opposite and thereof.

Therefore, the explanation about the same configuration is omitted here by attaching the same reference numerals to the same or corresponding parts or elements in FIGS. 13A, 13B and 14 for the sake of simplification of description.

To electrically connect the strip-shaped parts of the common electrically-conductive layer thus divided, a wiring line 31 is formed along the bit lines 52, which is perpendicular to the windows 6 and 16. The wiring line 31 is formed on the interlayer insulating layer 8d. The wiring line 31 is contacted with and electrically connected to the lower electrodes 9 through contact holes 32 penetrating the interlayer insulating layer 8d. The ferroelectric layer 1 is selectively removed at the area just over the wiring line 31, allowing the wiring line 31 to reach the lower electrodes 9.

It is needless to say that there are the same advantages as those in the first embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor memory device having memory cells formed on a semiconductor substrate;
    each of said memory cells including a select transistor formed on said substrate and a storage capacitor for electric-charge storing formed over said substrate through a first interlayer insulating layer;
    each of said storage capacitors having a lower electrode, an upper electrode, and a dielectric sandwiched by said lower and upper electrodes;
    said semiconductor memory device comprising:
    (a) said lower electrodes being formed by a patterned, common electrically-conductive layer formed on said first interlayer insulating layer;
    (b) said common electrically-conductive layer having a first plurality of windows arranged regularly in rows and columns of a matrix array;
    (c) said dielectric being formed by a patterned, common ferroelectric layer formed on said common electrically-conductive layer;
        said common ferroelectric layer being entirely overlapped with said common electrically-conductive layer;
        said common ferroelectric layer having a second plurality of windows overlapped with said first plurality of windows of said common electrically-conductive layer;
    (d) all of said upper electrodes being regularly arranged on said common ferroelectric layer;
        said upper electrodes being located at positions obliquely shifted by an angle of 45° with respect to the corresponding windows in said rows and columns of said matrix array in which said first plurality of windows of said common electrically-conductive layer and said second plurality of windows of said common ferroelectric layer are aligned; and
    (e) wiring lines formed over said upper electrodes through a second interlayer insulating layer covering said storage capacitors;
        all of said wiring lines being arranged in a common layer at a 45° angle with respect to said matrix array and substantially in the same plane as said first and second windows and being electrically connected to said upper electrodes through a first plurality of contact holes penetrating said second interlayer insulating layer;
        said wiring lines being electrically connected to said select transistors through said second plurality of windows of said common ferroelectric layer, said first plurality of windows of said common electrically-conductive layer, and a second plurality of contact holes penetrating said second and first interlayer insulating layers.

2. A device as claimed in claim 1, wherein each of said first plurality of windows of said lower electrodes has a closed contour, and each of said second plurality of windows of said dielectrics has a closed contour.

3. A device as claimed in claim 2, wherein said closed contour of said first plurality of windows is a same as said closed contour of said second plurality of windows.

4. A device as claimed in claim 1, wherein each of said first plurality of windows of said lower electrodes has a linear shape extending along said rows or columns in which said second and first pluralities of windows are aligned, and each of said second plurality of windows of said dielectrics has a linear shape entirely overlapped with said first plurality of windows.

5. A semiconductor memory device having memory cells formed on a semiconductor substrate;

each of said memory cells including a select transistor formed on said substrate and a storage capacitor for electric-charge storing formed over said substrate through a first interlayer insulating layer;

each of said storage capacitors having a lower electrode, and upper electrode, and a dielectric sandwiched by said lower and upper electrodes;

said semiconductor memory device comprising:

(a) said lower electrodes being formed by a patterned, common electrically-conductive layer formed on a said first interlayer insulating layer;

(b) said common electrically-conductive layer having a first plurality of windows arranged regularly in rows and columns of a matrix array;

(c) said dielectric being formed by a patterned, common ferroelectric layer formed on said common electrically-conductive layer;

said common ferroelectric layer being entirely overlapped with said common electrically-conductive layer;

said common ferroelectric layer having a second plurality of windows overlapped with said first plurality of windows of said common electrically-conductive layer;

(d) all of said upper electrodes being regularly arranged on said common ferroelectric layer;

said upper electrodes being located at positions obliquely shifted by an angle of 45° with respect to the corresponding windows in said rows or columns of said matrix array in which said first plurality of windows of said common electrically-conductive layer and said second plurality of windows of said common ferroelectric layer are aligned; and (e) wiring lines formed over said upper electrodes through a second interlayer insulating layer covering said storage capacitors;

all of said wiring lines being arranged in a common layer at a 45° angle with respect to said matrix array and substantially in the same plane as said first and second windows and being electrically connected to said upper electrodes through a first plurality of contact holes penetrating said second interlayer insulating layer;

said wiring lines being electrically connected to said select transistors through said second plurality of windows of said common ferroelectric layer, said first plurality of windows of said common electrically-conductive layer, and a second plurality of contact holes penetrating said second and first interlayer insulating layers.

6. A device as claimed in claim 5, wherein each of said first plurality of windows of said lower electrodes has a closed contour, and each of said second plurality of windows of said dielectrics has a closed contour.

7. A device as claimed in claim 6, wherein said closed contour of said first plurality of windows is a same as said closed contour of said second plurality of windows.

8. A device as claimed in claim 5, wherein said wiring lines extend along said rows and columns in which said second and first pluralities of windows are aligned.

9. A device as claimed in claim 5, wherein each of said first plurality of windows of said lower electrodes has a rectangular shape extending along said rows or columns in which said second and first pluralities of windows are aligned, and each of said second plurality of windows of said dielectrics has a rectangular shape extending along said first plurality of windows;

and wherein two adjacent ones of said lower electrodes are electrically connected to one another through a connection part of said common electrically-conductive layer.

10. A device as claimed in claim 5, wherein each of said first plurality of windows of said lower electrodes has a rectangular shape extending along said rows or columns in which said second and first pluralities of windows are aligned, and each of said second plurality of windows of said dielectrics has a rectangular shape extending along said first plurality of windows;

and wherein said common electrically-conductive layer is divided into parts by said first plurality of windows, and said common ferroelectric layer is divided into parts by said second plurality of windows;

and wherein said lower electrodes are electrically connected to one another through an interconnection line.

* * * * *

UNITED STATES PATENT AND TRADEMARK OFFICE
CERTIFICATE OF CORRECTION

PATENT NO. : 6,323,510 B1
DATED : November 27, 2001
INVENTOR(S) : Tanabe et al.

It is certified that error appears in the above-identified patent and that said Letters Patent is hereby corrected as shown below:

<u>Title page,</u>
Item [54], insert "WITH" after -- CAPACITOR --

Signed and Sealed this

Twenty-first Day of May, 2002

Attest:

Attesting Officer

JAMES E. ROGAN
*Director of the United States Patent and Trademark Office*